(12) United States Patent
Naganuma et al.

(10) Patent No.: US 10,000,061 B2
(45) Date of Patent: Jun. 19, 2018

(54) PIEZOELECTRIC DEVICE, LIQUID EJECTING HEAD, AND LIQUID EJECTING APPARATUS

(71) Applicant: Seiko Epson Corporation, Tokyo (JP)

(72) Inventors: Yoichi Naganuma, Matsumoto (JP); Eiju Hirai, Azumino (JP); Yoshihiro Hokari, Azumino (JP); Masao Nakayama, Shiojiri (JP); Takeshi Saito, Matsumoto (JP); Toshihiro Shimizu, Fujimi-machi (JP)

(73) Assignee: Seiko Epson Corporation (JP)

( * ) Notice: Subject to any disclaimer, the term of this patent is extended or adjusted under 35 U.S.C. 154(b) by 0 days. days.

(21) Appl. No.: 15/388,655

(22) Filed: Dec. 22, 2016

(65) Prior Publication Data
US 2017/0197414 A1 Jul. 13, 2017

(30) Foreign Application Priority Data
Jan. 13, 2016 (JP) ................. 2016-004166

(51) Int. Cl.
| | |
|---|---|
| B41J 2/14 | (2006.01) |
| H01L 41/277 | (2013.01) |
| H01L 41/047 | (2006.01) |
| H01L 41/083 | (2006.01) |
| H01L 41/297 | (2013.01) |
| H04R 17/00 | (2006.01) |
| H01L 41/08 | (2006.01) |
| H01L 41/332 | (2013.01) |

(52) U.S. Cl.
CPC ....... *B41J 2/14201* (2013.01); *B41J 2/14233* (2013.01); *H01L 41/0471* (2013.01); *H01L 41/081* (2013.01); *H01L 41/083* (2013.01); *H01L 41/277* (2013.01); *H01L 41/297* (2013.01); *H01L 41/332* (2013.01); *H04R 17/00* (2013.01); *B41J 2202/11* (2013.01)

(58) Field of Classification Search
CPC ... B41J 2/14201; B41J 2/14233; H04R 17/00; H01L 41/083; H01L 41/0471; H01L 41/277; H01L 41/297
See application file for complete search history.

(56) References Cited

U.S. PATENT DOCUMENTS

2007/0284967 A1    12/2007  Shimada et al.
2008/0186364 A1*   8/2008   Sugahara ............. B41J 2/14233
                                                    347/70

FOREIGN PATENT DOCUMENTS

JP        2007-329285 A    12/2007

\* cited by examiner

*Primary Examiner* — Geoffrey Mruk
(74) *Attorney, Agent, or Firm* — Harness, Dickey & Pierce, P.L.C.

(57) ABSTRACT

A piezoelectric device includes a supporting body, a supporting layer that is stacked on the supporting body, a first electrode that is formed on a side opposite to the supporting body side of the supporting layer, a piezoelectric body that is formed on a side opposite to the supporting layer side of the first electrode, and a second electrode that is formed on a side opposite to the first electrode side of the piezoelectric body, in which the piezoelectric body is formed throughout an area covering the first electrode, the second electrode is formed throughout an area covering the piezoelectric body, and a recess portion which is recessed toward the supporting body is formed outside an area overlapping with the first electrode in the supporting layer.

21 Claims, 14 Drawing Sheets

PIEZOELECTRIC DEVICE, LIQUID EJECTING HEAD, AND LIQUID EJECTING APPARATUS

BACKGROUND

1. Technical Field

The present invention relates to a piezoelectric device in which a plurality of piezoelectric elements is arranged in parallel, a liquid ejecting head including the piezoelectric device, and a liquid ejecting apparatus.

2. Related Art

A liquid ejecting apparatus is an apparatus which includes a liquid ejecting head and ejects various types of liquid from the liquid ejecting head. As an example of such a liquid ejecting apparatus, there is an image recording apparatus such as an ink jet type printer or an ink jet type plotter, and recently, the liquid ejecting apparatus has been applied to various types of manufacturing apparatuses for the characteristic thereof that a very small amount of liquid can be landed accurately on a predetermined position. For example, the liquid ejecting apparatus has been applied to a display manufacturing apparatus which manufactures a color filter such as a liquid crystal display, an electrode forming apparatus which forms an electrode for an organic electro luminescence (EL) display, a field emission display (FED), or the like, and a chip manufacturing apparatus which manufactures a bio chip (biochemical element). A recording head of the image recording apparatus ejects ink of a liquid type, and a color material ejecting head for the display manufacturing apparatus ejects a solution of each color material of R (Red), G (Green), and B (Blue). In addition, an electrode material ejecting head for the electrode forming apparatus ejects an electrode material of a liquid type, and a biochemical organic substance ejecting head for the chip manufacturing apparatus ejects a bio organic substance solution.

The liquid ejecting head described above includes a plurality of pressure chambers and a piezoelectric device which generates the pressure fluctuation in liquid inside each pressure chamber. The piezoelectric device is configured to have a vibration plate which divides one side of the pressure chamber (for example, a side opposite to a nozzle plate on which nozzles are formed) and a piezoelectric element formed in every pressure chamber on the vibration plate. Here, as a piezoelectric element, it is known that the piezoelectric element is configured with, for example, in an order from a side close to the vibration plate, a lower electrode which functions as a common electrode with respect to a plurality of the pressure chambers, a piezoelectric body which is formed in every pressure chamber, and an upper electrode which functions as an individual electrode (for example, Japanese Patent No. 4321552). In addition, a part of a piezoelectric body layer sandwiched between the upper electrode layer and the lower electrode layer is a function portion (active portion) which is deformed by applying a voltage to both electrode layers.

The liquid ejecting head disclosed in Japanese Patent No. 4321552 is formed to have a thickness of a region between the adjacent two piezoelectric elements which is thinner than a region of the piezoelectric element in the lower electrode formed throughout a plurality of piezoelectric elements. Further, in the liquid ejecting head, a recess portion is formed on a boundary part with the piezoelectric element in the lower electrode in the region between the adjacent two piezoelectric elements. According to this configuration, a displacement characteristic can be improved by the piezoelectric element. Moreover, in the piezoelectric element disclosed in Japanese Patent No. 4321552, in order to prevent deterioration of characteristic of the piezoelectric body, a moisture resistance protective film is formed on a taper portion of the piezoelectric body layer.

In the piezoelectric device disclosed in Japanese Patent No. 4321552, if the recess portion formed on a lower electrode is formed to be deeper, a displacement characteristic is further improved. However, in the piezoelectric device disclosed in Japanese Patent No. 4321552, there is a problem in that improvement of the displacement characteristic is less likely to be improved. It is because that if the recess portion formed on a lower electrode which is a common electrode is formed to be deeper, the lower electrode is separated and troubles occur in driving.

SUMMARY

The invention can be realized in the following aspects or application examples.

Application Example 1

According to an aspect of the invention, there is provided a piezoelectric device including a supporting body, a supporting layer that is stacked on the supporting body, a first electrode that is formed on a side opposite to the supporting body side of the supporting layer, a piezoelectric body that is formed on a side opposite to the supporting layer side of the first electrode, and a second electrode that is formed on a side opposite to the first electrode side of the piezoelectric body, in which the piezoelectric body is formed throughout an area covering the first electrode, the second electrode is formed throughout an area covering the piezoelectric body, and a recess portion which is recessed toward the supporting body is formed outside an area overlapping with the first electrode in the supporting layer.

According to this application example, since the recess portion is positioned outside the area overlapping with the first electrode formed on the side opposite to the supporting body side of the supporting layer, the recess portion can be prevented from being formed on the first electrode. Therefore, it is easy to avoid occurrence of troubles in driving of the piezoelectric device. In addition, in the piezoelectric device, since the recess portion is formed on the supporting layer, stiffness of the supporting layer can be deteriorated. Therefore, the displacement characteristic at the time of applying a voltage to the piezoelectric body is likely to be improved.

Application Example 2

In the piezoelectric device, it is preferable that the recess portion be formed outside an area overlapping with the piezoelectric body in the supporting layer.

According to this application example, the recess portion can be prevented from being formed on the piezoelectric body.

Application Example 3

In the piezoelectric device, it is preferable that a bottom surface of the recess portion be a curved surface.

According to this application example, the bottom surface of the recess portion is a curved surface, stress focus at the time of deforming the supporting layer can be reduced, and the reliability can be improved.

Application Example 4

In the piezoelectric device, it is preferable that the supporting layer include a first supporting layer and a second supporting layer formed on a side opposite to the supporting body side of the first supporting layer, and the bottom surface of the recess portion be formed on the first supporting layer.

According to this application example, since the recess portion penetrates the second supporting layer and reaches the first supporting layer, the displacement characteristic can be further improved.

Application Example 5

In the piezoelectric device, it is preferable that the piezoelectric body be made of a material including lead, and the second supporting layer be made of zirconia.

According to this application example, zirconia is likely to prevent lead included in the piezoelectric body from spreading on the first supporting layer, the piezoelectric device having high reliability can be provided.

Application Example 6

In the piezoelectric device, it is preferable that the first supporting layer be made of silicon oxide.

According to this application example, when silicon oxide having smaller Young's modulus than zirconia is used as the first supporting layer, the displacement characteristic of the supporting layer can be further improved.

Application Example 7

According to another aspect of the invention, there is provided a manufacturing method of a piezoelectric device including forming a supporting layer on a supporting body, forming a first electrode on a side opposite to a supporting body side of the supporting layer, forming a piezoelectric body on a side opposite to the supporting layer side of the first electrode throughout an area covering the first electrode; and forming a second electrode on a side opposite to the first electrode side of the piezoelectric body throughout an area covering the piezoelectric body, in which the forming of the piezoelectric body includes forming a piezoelectric body layer of a material constituting the piezoelectric body, and patterning the piezoelectric body from the piezoelectric body layer, and in the patterning of the piezoelectric body from the piezoelectric body layer, a recess portion which is recessed toward the supporting body is formed outside an area overlapping with the first electrode in the supporting layer.

According to this application example, since the recess portion is formed in the patterning of the piezoelectric body from the piezoelectric body layer, the piezoelectric body and the recess portion can be formed in the same process. Accordingly, processes can be reduced when compared with a case in which the piezoelectric body and the recess portion are formed in separate processes.

Application Example 8

According to still another aspect of the invention, there is provided a liquid ejecting head including the piezoelectric device.

According to this application example, the displacement characteristic of the piezoelectric device can be improved in the liquid ejecting head.

Application Example 9

According to still another aspect of the invention, there is provided a liquid ejecting apparatus including the liquid ejecting head.

According to this application example, the displacement characteristic of the piezoelectric device in the liquid ejecting head of the liquid ejecting apparatus can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments for realizing the invention will be described with reference to attached drawings. Moreover, in the embodiments to be described below, there are various limitations as preferred specific examples of the invention; however, a range of the invention is not limited to these aspects unless specified disclosure to limit the invention in a description hereinbelow. In addition, in the description hereinbelow, as a piezoelectric device according to the invention, a case in which an actuator for ejecting ink is used in an ink jet printer (hereinafter, printer) which is a type of a liquid ejecting apparatus on which an ink jet type recording head (hereinafter, recording head), which is a type of an liquid ejecting head, is mounted is exemplified.

Embodiment 1

Figure 1:
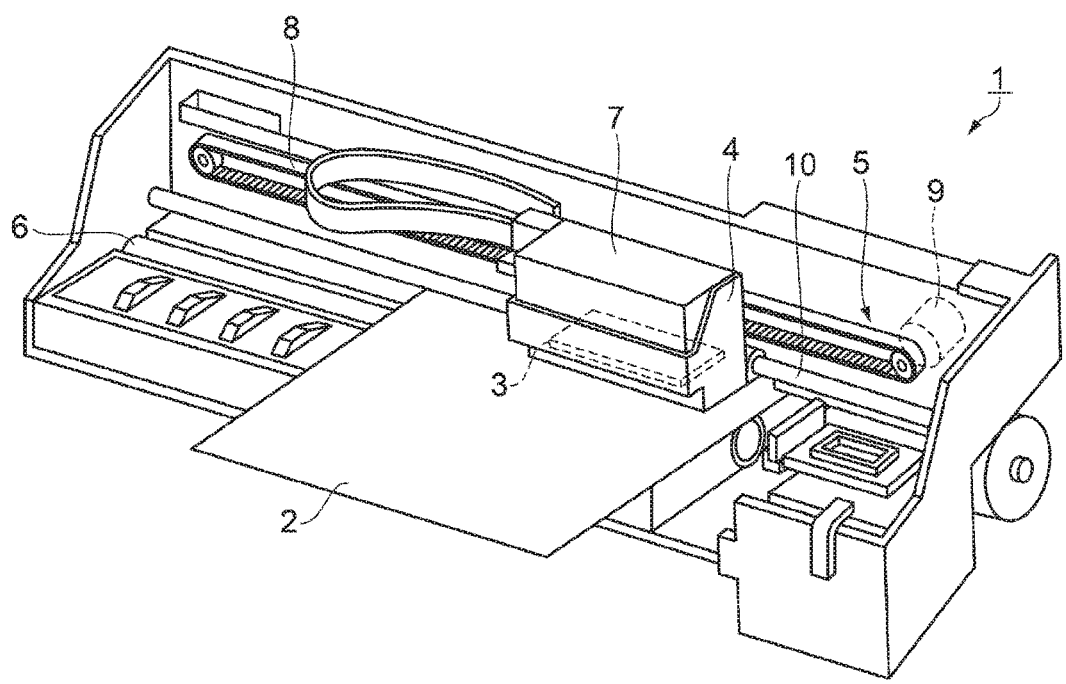
FIG. 1 is a perspective view illustrating a configuration of a printer.

A configuration of a printer 1 will be described with reference to FIG. 1. The printer 1 is an apparatus which records an image, or the like by ejecting ink, which is a type of liquid, onto a surface of a recording medium 2 such as a recording sheet (a type of landing target). The printer 1 includes a recording head 3, a carriage 4 to which the recording head 3 is attached, a carriage moving mechanism 5 which moves the carriage 4 in a main scan direction, a transportation mechanism 6 which moves the recording medium 2 in a sub scan direction, and the like. Here, the ink described is reserved in an ink cartridge 7 as a liquid supply source. The ink cartridge 7 is detachably mounted in the recording head 3. Moreover, a configuration can be adopted in which the ink cartridge is disposed on the main body of a printer and the ink is supplied from the ink cartridge to the recording head through an ink supply tube.

The carriage moving mechanism 5 includes a timing belt 8. The timing belt 8 is driven by a pulse motor 9 such as a DC motor. Therefore, when the pulse motor 9 is operated, the carriage 4 is guided by a guide rod 10 provided in the printer 1 and is reciprocated in the main scan direction (width direction of recording medium 2).

Figure 2:
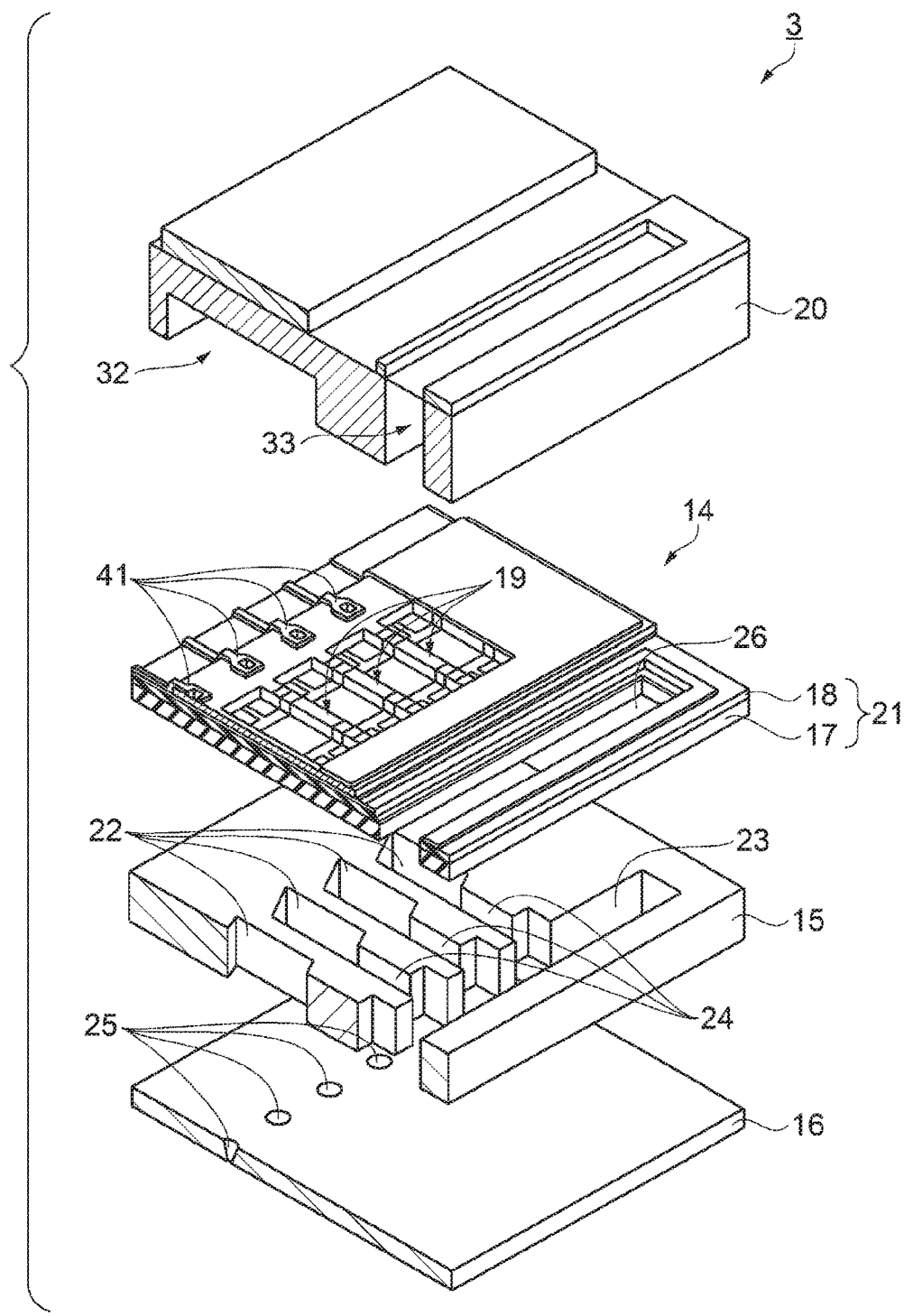
FIG. 2 is an exploded perspective view of a recording head.
Figure 3:
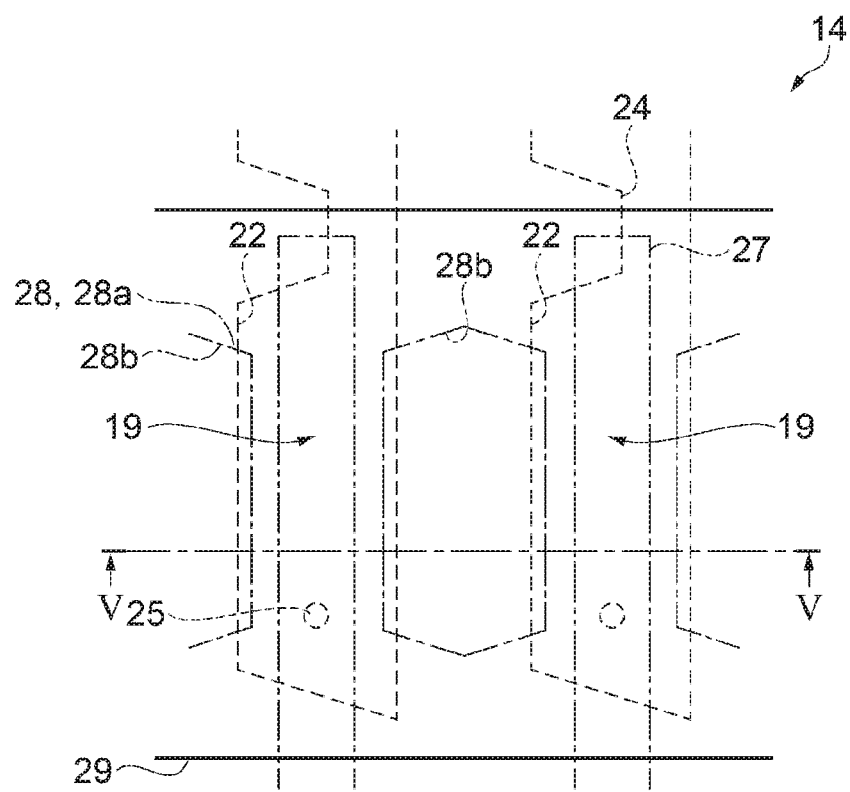
FIG. 3 is a plan view of a piezoelectric device.
Figure 4:
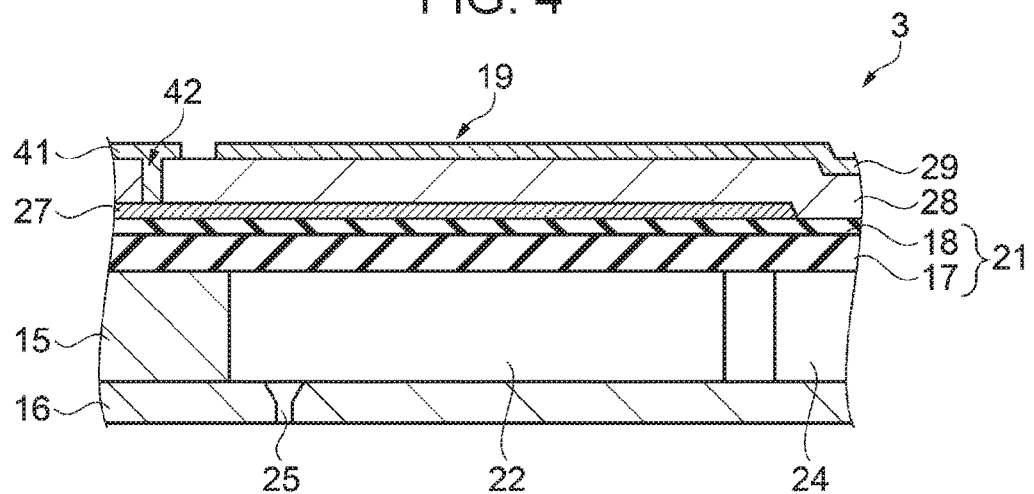
FIG. 4 is a schematic view illustrating a configuration of a main part of the recording head, which is a cross section taken along a direction orthogonal to a nozzle row.
Figure 5:
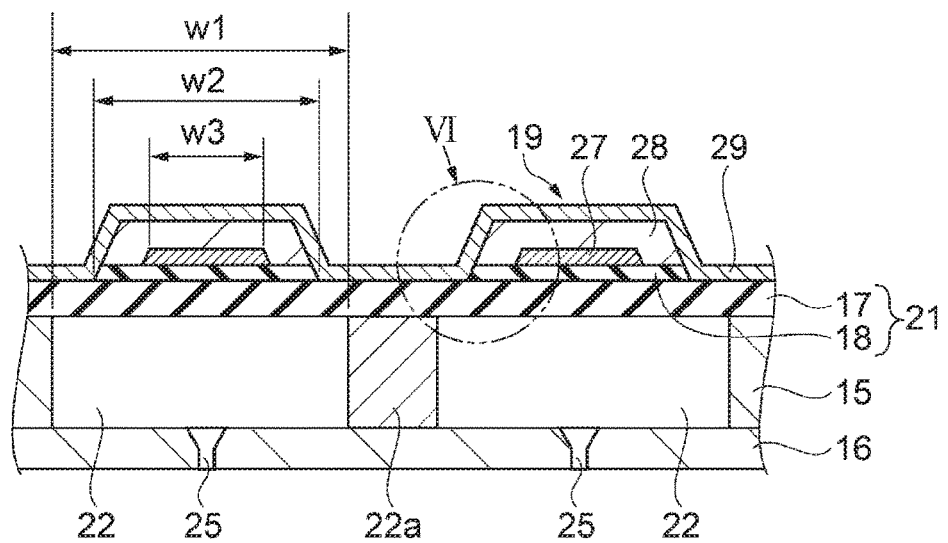
FIG. 5 is a cross sectional view taken along line V-V in FIG. 3.

FIG. 2 is an exploded perspective view illustrating a configuration of the recording head 3 of the embodiment. In addition, FIG. 3 is a plan view (top view) of a piezoelectric device 14 and is a plan view of the recording head 3 which is not bonded with a sealing plate 20 to be described later. Further, FIG. 4 and FIG. 5 are views illustrating a configuration of a main part of the recording head 3. FIG. 4 is a sectional schematic view taken in a direction orthogonal to a nozzle row, and FIG. 5 is a sectional schematic view taken in a nozzle row (sectional view of III-III in FIG. 3).

The recording head 3 in the embodiment is configured by stacking a pressure chamber forming substrate 15 (corresponding to the supporting body in the invention), a nozzle plate 16, a piezoelectric device 14, a sealing plate 20, and the like. The pressure chamber forming substrate 15 is, for example, a plate member which is formed of a silicon single crystal substrate. In the pressure chamber forming substrate 15, as illustrated in FIG. 5, spaces (hereinafter, arbitrary, referring to as a pressure chamber space), which are a plurality of pressure chambers 22, are arranged in parallel while respectively including a partition wall 22a being interposed therebetween. As illustrated in FIG. 3, the pressure chamber space (pressure chamber 22) is a space extended in a direction orthogonal to a nozzle row direction, and is provided to correspond to each of nozzles 25 of the nozzle plate 16 one to one. That is, each of the pressure chamber spaces (each pressure chamber 22) is arranged in parallel in the nozzle row direction (a first direction in the invention) at the same pitch as a formation pitch of the nozzle 25. Moreover, an upper opening (opening opposite to nozzle 25 side) of the pressure chamber space (pressure chamber 22) in the embodiment is, as illustrated in FIG. 3, formed in a sectional trapezoidal shape. Regarding a size of the pressure chamber space, a height thereof (that is, a thickness of the pressure chamber forming substrate 15) is set to substantially 70 μm. In addition, a length (a size of the pressure chamber space in a direction orthogonal to a nozzle row direction or a pressure chamber parallel direction) of the pressure chamber space (in detail, upper opening) is set to substantially 360 μm. Further, a width w1 (the width w1 of the pressure chamber space in the nozzle row direction or the pressure chamber parallel direction (referring to FIG. 5)) of the pressure chamber space (in detail, upper opening) is set to substantially 70 μm.

In addition, as illustrated in FIG. 2, in the pressure chamber forming substrate 15, in an area deviated from a side (a side opposite to a side communicating with the nozzles 25) in a longitudinal direction of the pressure chamber space with respect to the pressure chamber space, a communication portion 23 penetrating the pressure chamber forming substrate 15 is formed along a parallel direction of the pressure chamber space (nozzle row direction). The communication portion 23 is a space common to each pressure chamber space. The communication portion 23 and each pressure chamber space communicate with each other through an ink supply passage 24. Moreover, a reservoir (common liquid chamber) which is an ink chamber common to each pressure chamber space (pressure chamber 22) is configured to have the communication portion 23 which communicates with a communication opening portion 26 of a vibration plate 21 and a liquid chamber space portion 33 of the sealing plate 20 to be described later. The ink supply passage 24 has a width narrower than that of the pressure chamber space, and is a part having passage resistance to the ink flowing into the pressure chamber space from the communication portion 23.

The nozzle plate 16 (nozzle forming substrate) is bonded to a lower surface of the pressure chamber forming substrate 15 (a surface of a side opposite to a surface side bonded to the piezoelectric device 14) by an adhesive, a heat-welding film, or the like. In the nozzle plate 16 in the embodiment, each of nozzles 25 is arranged in parallel at a pitch (that is, a distance between the centers of adjacent nozzles 25) corresponding to a dot formation density (for example, 300 dpi to 600 dpi). As illustrated in FIG. 3, each of the nozzles 25 communicates with an end portion of an opposite side to the ink supply passage 24 with respect to the pressure chamber space. Moreover, the nozzle plate 16 is formed of, for example, a silicon single crystal substrate, stainless steel, or the like.

Figure 6:
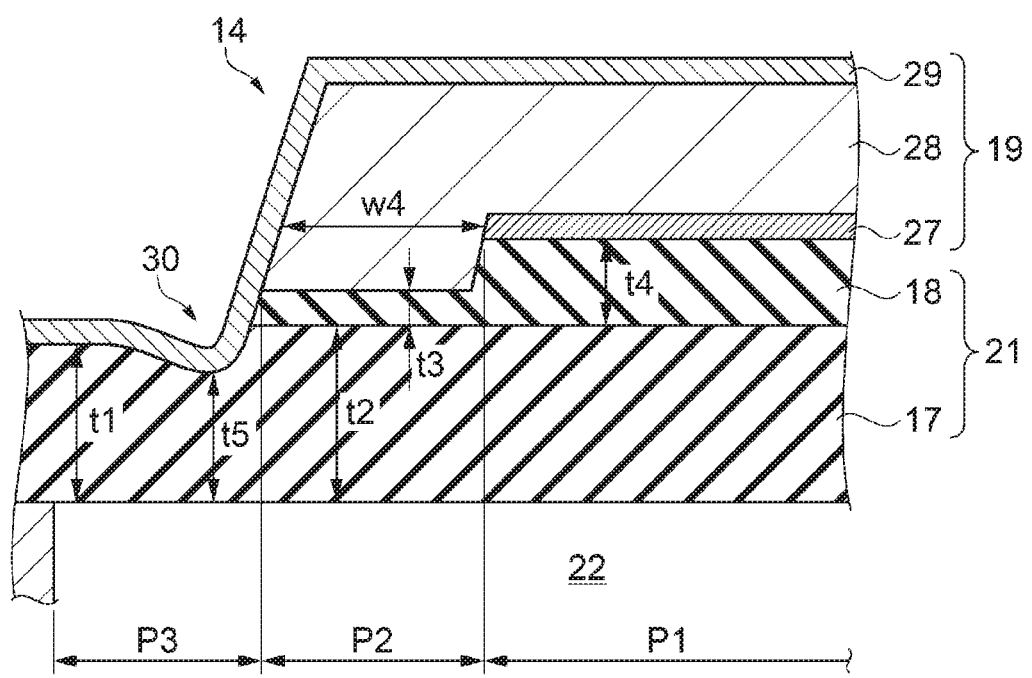
FIG. 6 is an enlarged view of an area VI in FIG. 5.

As illustrated in FIG. 2, the piezoelectric device 14 is a device having a thin plate shape that functions as an actuator generating pressure fluctuation in the ink inside the pressure chamber 22, and is configured to have the vibration plate 21 (supporting body in the invention) and a plurality of the piezoelectric elements 19. The vibration plate 21 is configured to have an elastic body 17 and an insulation body 18. The elastic body 17 (corresponding to a first supporting layer in the invention), which is formed of silicon oxide (SiOx) (for example, silicon dioxide ($SiO_2$)), is formed on an upper surface of the pressure chamber forming substrate 15. The insulation body 18 (corresponding to a second supporting layer in the invention), which is formed of zirconium oxide (ZrOx) (for example, zirconium dioxide ($ZrO_2$)), is stacked on the elastic body 17. A part corresponding to the pressure chamber space in the vibration plate 21, that is, a part, which divides a part of the pressure chamber 22 by blocking the upper opening of the pressure chamber space, functions as a displacement portion which displaces their positions in a direction far away from or close to the nozzles 25 according to the bending deformation of the piezoelectric element 19. As illustrated in FIG. 6, the vibration plate 21 in the displacement portion (area corresponding to pressure chamber 22) can be divided into three areas P1, P2, and P3 with a positional relationship between an upper electrode 29, a piezoelectric body 28, and a lower electrode 27 to be described later. In addition, as illustrated in FIG. 5 and FIG. 6, the insulation body 18 between the piezoelectric elements 19 (in detail, the area P3) is removed. Here, the recess portion 30 having a curved shape bottom surface is formed outside a boundary of overlapping areas of the piezoelectric body 28 in the elastic body 17. Therefore, since the bottom surface of the recess portion 30 is a curved shape, a stress applied at the time of deforming the vibration plate can be reduced, and thus reliability of the piezoelectric device can be improved. A method for forming the recess portion 30 will be described later. Moreover, a thickness of the vibration plate 21 of each of the areas P1, P2, and P3 will be described in detail. In addition, as illustrated in FIG. 2, in a part corresponding to the communication portion 23 of the pressure chamber forming substrate 15 in the vibration plate 21, the communication opening portion 26 communicating with the corresponding communication portion 23 is provided.

In a part corresponding to the pressure chamber space of the vibration plate 21 (insulation body 18), in other words, in an upper surface (a surface of a side opposite to the nozzle 25) of the displacement portion of the pressure chamber 22, the piezoelectric element 19 is respectively formed. That is, according to the pressure chamber spaces which are arranged in parallel along the nozzle row direction, the piezoelectric elements 19 are arranged in parallel along the nozzle row direction. As illustrated in FIG. 4 and FIG. 5, the piezoelectric elements 19 in the embodiment are configured to have the lower electrode 27 (corresponding to a first electrode layer in the invention), the piezoelectric body 28, and the upper electrode 29 (corresponding to a second electrode layer in the invention) which are stacked sequentially on the insulation body 18 with a film deposition technology.

Moreover, the upper electrode 29 and the lower electrode 27 are formed of various metals such as iridium (Ir), platinum (Pt), titanium (Ti), tungsten (W), tantalum (Ta), and molybdenum (Mo), or alloys thereof. An example of an alloy electrode includes $LaNiO_3$, or the like. In addition, as the piezoelectric body 28, a ferroelectric piezoelectric material such as lead zirconate titanate (PZT), or a relaxor ferroelectric material in which metals such as niobium, nickel, magnesium, bismuth, or yttrium are added to the ferroelectric piezoelectric material, and the like is used.

Moreover, lead zirconate titanate (PZT) is formed of a material including lead. However, as a material of the piezoelectric body 28, it is not limited thereto, and it is possible to also use non-lead materials such as barium titanate. Further, regarding the thickness of a film, the thickness of the upper electrode 29 is preferably set to 15 nm to 100 nm, and in this embodiment, the thickness thereof is set to substantially 70 nm. In addition, a thickness of the piezoelectric body 28 (in detail, the thickness of the piezoelectric body 28 in the area P1) is preferably set to 0.7 µm to 5 µm, and in this embodiment, the thickness thereof is set to substantially 1 µm. Further, a thickness of the lower electrode 27 is preferably set to 50 nm to 300 nm, and in this embodiment, the thickness thereof is set to substantially 150 nm.

Here, as illustrated in FIG. 5, the lower electrode 27 is provided independently in every pressure chamber 22, but the upper electrode 29 is successively provided throughout a plurality of the pressure chambers 22. Accordingly, the lower electrode 27 is a separate electrode provided in every pressure chamber 22, and the upper electrode 29 is a common electrode common to each of the pressure chambers 22. Here, the upper electrode 29 is directly stacked on the elastic body 17, but as illustrated in FIG. 6, since the inside of the recess portion 30 becomes a curved surface, the upper electrode 29 of the common electrode covering power or adhesion becomes good. Accordingly, voltage drop does not occur, and thus troubles do not occur in driving of the piezoelectric device. Further, since the upper electrode 29 functions for moisture resistance of the piezoelectric body, a process of forming a moisture resistance protective film is not required, and manufacturing costs can be reduced.

Specifically, as illustrated in FIG. 3 and FIG. 5, both end portions in the nozzle row direction of the upper electrode 29 are provided so as to extend over an edge of the upper opening of the pressure chamber space to the outside of a plurality of the pressure chamber spaces (pressure chamber 22) which are arranged in parallel. Moreover, the both end portions in a longitudinal direction (a direction orthogonal to the nozzle row direction) of the pressure chamber 22 (pressure chamber space) of the upper electrode 29 are provided so as to extend to the outside of the corresponding pressure chamber space (the pressure chamber 22) over the edge of the upper opening of the pressure chamber space. Meanwhile, the lower electrode 27 extends to a position where an end portion of one side (upper side in FIG. 3) overlaps the ink supply passage 24 over an edge of the upper opening of the pressure chamber 22 in the longitudinal direction of the pressure chamber 22 (pressure chamber space), and an end portion of another side (lower side in FIG. 3) extends to a lead electrode portion 41. In addition, in the embodiment, as illustrated in FIG. 5, a width w3 of the nozzle row direction of the lower electrode 27 on the pressure chamber space (an area corresponding to the pressure chamber 22) is formed to be narrower than the width w1 of the same direction of the pressure chamber 22 (in detail, the upper opening of the pressure chamber space). Further, the piezoelectric body 28 on the pressure chamber space extends to the outside of the lower electrode 27 in the nozzle row direction, and a width w2 of the nozzle row direction is formed to be narrower than the width w1 of the same direction of the pressure chamber 22 and is wider than the width w3 of the same direction of the lower electrode 27. That is, sizes of the nozzle row direction are short in the order of the width of the upper electrode 29, the width w1 of the pressure chamber 22, the width w2 of the piezoelectric body 28, and the width w3 of the lower electrode 27.

Here, the width w2 of the piezoelectric body 28 of the nozzle row direction on the pressure chamber space is preferably set to 30 μm to 60 μm, and in the embodiment, the width thereof is set to substantially 52 μm. In addition, the width w3 of the lower electrode 27 is preferably set to 15 μm to 60 μm, and in the embodiment, the width thereof is set to substantially 40 μm. Further, a distance w4 from an external end portion of one side of the lower electrode 27 to an external end portion of the same side of the piezoelectric body 28 (that is, a width w4 of an area P2 of one side in the nozzle row direction (referring to FIG. 6)) is preferably set to 2.5 μm to 8.0 μm, and in the embodiment, the distance thereof is set to substantially 6 μm.

In addition, in the embodiment, as illustrated in FIG. 3, the piezoelectric body 28 is separated in every piezoelectric element 19 by an opening portion 28b in which the piezoelectric body 28 (a PZT 28a which is the piezoelectric body 28) is partially removed. Specifically, the piezoelectric body 28 extends to the outside over the both end portions of the longitudinal direction of the pressure chamber 22 (in detail, an edge of the upper openings of both sides of the pressure chamber space), and is formed throughout the plurality of the pressure chambers 22. Therefore, the piezoelectric body 28 of the corresponding area between the adjacent pressure chambers 22 is partially removed, and the opening portion 28b in which the piezoelectric body 28 is not stacked is formed in plural. That is, the plurality of the opening portions 28b is formed along the nozzle row direction at the same pitch as the formation pitch (formation pitch of nozzle 25) of the pressure chamber 22. In other words, between the opening portion 28b and the opening portion 28b, the piezoelectric element 19 corresponding to one pressure chamber 22 is formed at the same pitch as the formation pitch of the pressure chamber 22. Moreover, the opening portion 28b in the embodiment, in a plan view, is formed to be long in a hexagonal shape along the longitudinal direction of the pressure chamber 22. In addition, in the longitudinal direction of the pressure chamber 22, the piezoelectric body 28 of the area deviated from the opening portion 28b is successively formed throughout the plurality of pressure chambers 22.

Further, in the embodiment, as illustrated in FIG. 4, on the piezoelectric body 28 in an area deviated from outside of the longitudinal direction of the pressure chamber space further than the edge of the upper opening of the pressure chamber space, the lead electrode portion 41 is formed at a position (a position in the left side in FIG. 4) at predetermined intervals with respect to the upper electrode 29. The lead electrode portion 41 is patterned according to the lower electrode 27 which is a separate electrode, and transfers a driving voltage (driving pulse) to each piezoelectric element 19. That is, the driving voltage (driving pulse) is selectively applied to each piezoelectric element 19 through the lead electrode portion 41. Moreover, a through hole 42 is formed from the upper surface of the piezoelectric body 28 to the lower electrode 27 in the piezoelectric body 28 in the lead electrode portion 41 in a state of penetrating the piezoelectric body 28. The lead electrode portion 41 is electrically connected to the lower electrode 27 through the through hole 42.

As illustrated in FIG. 2, the sealing plate 20 is bonded to an upper surface opposite to a lower surface which is a surface bonded to the pressure chamber forming substrate 15 in the piezoelectric device 14. The sealing plate 20 includes an accommodation space portion 32 which is capable of accommodating the piezoelectric element 19 and the liquid chamber space portion 33 formed on the area corresponding to the communication opening portion 26 of the vibration plate 21 and the communication portion 23 of the pressure chamber forming substrate 15, at a position deviated to the outside of the direction orthogonal to the nozzle row than the accommodation space portion 32. The liquid chamber space portion 33 is formed in a parallel direction of the pressure chamber space (pressure chamber 22) by being penetrated in a thickness direction of the sealing plate 20, and as described above, a reservoir, which is an ink chamber common to each pressure chamber space, is dividedly formed by making the communication opening portion 26 and the communication portion 23 communicate with each other in series. Moreover, it is not illustrated, in the sealing plate 20, in addition to the accommodation space portion 32 and the liquid chamber space portion 33, a wire opening portion penetrating the sealing plate 20 in the thickness direction is provided, and an end portion of the lead electrode portion 41 is exposed in the wire opening portion. A terminal of a wire member (not illustrated) from the printer main body is electrically connected to the exposed part of the lead electrode portion 41.

Such a recording head 3 fills the inside of a series of ink passages reaching the nozzles 25 with the ink by supplying the ink from the ink cartridge 7 at the time of ejecting the ink through the reservoir, the ink supply passage 24, the pressure chamber 22, and the like. By receiving the driving signal from the printer main body, when an electric field is applied between the lower electrode 27 and the upper electrode 29 respectively corresponding to the pressure chamber 22 in response to a potential difference of both electrodes, the displacement portions of the piezoelectric element 19 and the vibration plate 21 displace the positions, and pressure fluctuation is generated in the pressure chamber 22. The ink is ejected from the nozzle 25 by controlling the pressure fluctuation.

Here, in the piezoelectric device 14 according to the invention, as described above, since the piezoelectric element 19 in which the lower electrode 27, the piezoelectric body 28, and the upper electrode 29 are stacked is formed, the vibration plate 21 in an area (displacement portion) corresponding to the pressure chamber 22 is divided into three areas by a manner of overlapping each of layers 27, 28, and 29. Specifically, as illustrated in FIG. 6, the vibration plate 21 is divided into an area P1 in which the lower electrode 27, the piezoelectric body 28, and the upper electrode 29 are stacked, an area P2 in which the piezoelectric body 28 and the upper electrode 29 deviated from the lower electrode 27 are stacked, and the area P3 in which the only upper electrode 29 deviated from the lower electrode 27 and the piezoelectric body 28 is stacked. Moreover, in the embodiment, each of areas P1, P2, and P3 is formed in both sides of the nozzle row direction on the displacement portion of the vibration plate 21; however, since it is a bilaterally asymmetric, the areas will be described by focusing on one side of the area.

On the vibration plate 21 in the above described area P1, the piezoelectric body 28 is sandwiched between the lower electrode 27 and the upper electrode 29. For this reason, the piezoelectric body 28 stacked on the area P1 becomes a functioning portion (active portion) in which voltage distortion is generated by applying the voltage to the both electrode layers. Meanwhile, the piezoelectric body 28 is not sandwiched between the lower electrode 27 and the upper electrode 29, but the piezoelectric body 28 is sandwiched between the vibration plate 21 (insulation body 18) and the upper electrode 29, on the vibration plate 21 in the area P2 in which the lower electrode 27 is not formed. For this reason, the piezoelectric body 28 stacked on the area P2 becomes a non-functioning portion (non-active portion) in which voltage distortion is not generated even when applying a voltage to both electrode layers.

Then, in the recording head 3 according to the invention, the thickness of the vibration plate 21 in the area P3 farther away than an area where the piezoelectric body 28 is stacked is thinner than the thickness of the vibration plate 21 in the areas P1 and P2 where the piezoelectric body 28 is stacked. In other words, the thicknesses of the vibration plate 21 in the areas P1 and P2 are thicker than the thickness of the vibration plate 21 in the area P3. Specifically, the insulation body 18 in the area P3 is removed, and the upper electrode 29 is directly stacked on the elastic body 17. Specifically, in the embodiment, the thickness t1 of the elastic body 17 in the area P3 is thinner than the thickness t2 of the elastic body 17 in the areas P1 and P2. That is, the thickness t2 of the elastic body 17 in the areas P1 and P2 in which the piezoelectric body 28 and the upper electrode 29 are stacked is thicker than the thickness t1 of the elastic body 17 in the area P3 in which the upper electrode 29 is stacked on the elastic body 17, in the outside of the nozzle row direction farther away than the piezoelectric body 28. Accordingly, the thickness of the vibration plate 21 in the area P3 can be reduced more than the thickness of the vibration plate 21 in the areas P1 and P2.

In addition, in the embodiment, the thickness t3 of the insulation body 18 in the area P2 is thinner than the thickness t4 of the insulation body 18 in the area P1. That is, the thickness t4 of the insulation body 18 in the area P1 in which the lower electrode 27, the piezoelectric body 28, and the upper electrode 29 are stacked is thicker than the thickness t3 of the insulation body 18 in the area P2 in which the piezoelectric body 28 and the upper electrode 29 are stacked, in the outside of the nozzle row direction farther away than the lower electrode 27. Accordingly, the thickness of the vibration plate 21 in the area P1 can be thicker than the thickness of the vibration plate 21 in the area P2. That is, a relationship between the thicknesses of the vibration plate 21 in each of the areas P1, P2, and P3 of the vibration plate 21 is satisfied with an expression of P1>P2>P3 (that is, (t2+t4)>(t2+t3)>t1>t5).

Moreover, a difference between the thickness of the vibration plate 21 of the area P1 and the thickness of the vibration plate 21 of the area P2, and a difference between the thickness of the vibration plate 21 of the area P2 and the thickness of the vibration plate 21 of the area P3 are respectively preferably set to 5 nm to 50 nm, and are more respectively preferably 10 nm or more. For example, the thickness of the elastic body 17 in the areas P1 and P2 is set to substantially 1500 nm, the thickness of the insulation body 18 in the area P1 is set to substantially 420 nm, and the thickness of the insulation body 18 in the area P2 is set to substantially 380 nm. Accordingly, while the rigidity of the piezoelectric body 28 can reliably increase, a hindrance of the movement of the vibration plate 21 in the outside of the piezoelectric body 28 can be reliably suppressed. In addition, the thickness of the elastic body 17 in each of areas P1, P2, and P3 is preferably set to 300 nm to 2000 nm. Further, the thickness of the insulation body 18 in the area P1 is preferably set to 600 nm or less.

Accordingly, by removing the insulation body 18 of the area P3 positioned in the outside farther away than the piezoelectric body 28, while maintaining the thickness of the vibration plate 21 of the areas P1 and P2 in which the piezoelectric body 28 is respectively stacked, the thickness of the vibration plate 21 of the area P3 can be thinned. Accordingly, while securing a film thickness of the piezoelectric body 28 which obtains sufficient reliability, the displacement characteristic of the piezoelectric element 19 can be improved by decreasing the rigidity of the area P3 positioned in the outside farther away than the piezoelectric body 28. As a result, a deformed amount of the piezoelectric element 19 can increase. The displacement characteristic will be described. Meanwhile, the thickness of the vibration plate 21 of the area P3 is thin so that the hindrance of the movement of the vibration plate 21 positioned in the outside farther away than the piezoelectric body 28 can be suppressed, and the pressure fluctuation by the deformation of the piezoelectric element 19 can be efficiently transferred to the ink inside the pressure chamber 22. That is, transmission loss of the driving force of the piezoelectric element 19 with respect to the ink inside the pressure chamber 22 can be reduced. Accordingly, a driving voltage of the piezoelectric element 19 needed to eject a predetermined amount of the ink from the nozzles 25 can be decreased, and thus effective power saving can be achieved and a life span of the piezoelectric element 19 can be increased. As a result, the reliability of the recording head 3 is improved. In addition, the insulation body 18 made of zirconium oxide (ZrOx) is formed on the areas P1 and P2 in which the piezoelectric body 28 is stacked so that when the piezoelectric body 28 made of lead zirconate titanate (PZT) is formed by firing, it is possible to prevent lead included in the piezoelectric body 28 from spreading into a lower layer (elastic body 17).

Here, the displacement characteristic will be described. The displacement characteristic means ease of displacement at the time of displacing the vibration plate 21 inside the pressure chamber 22 by a drive of the piezoelectric element 19. For example, the displacement characteristic is quantitatively recognized using an amount of displacement of the vibration plate 21 at the time of driving the piezoelectric element 19 at a constant driving voltage. As an amount of deformation of the vibration plate 21 at the time of driving the piezoelectric element 19 at the same driving voltage is great, it becomes the displacement characteristic. The amount of displacement of the vibration plate 21 indicates an area of which the vibration plate 21 is deformed, in a sectional view illustrated in FIG. 5. In addition, in a case in which the piezoelectric device 14 is considered in a three-dimension, the amount thereof indicates a volume of which the vibration plate 21 is deformed.

In the embodiment, since the bottom surface of the recess portion 30 formed on the area P3 becomes a curved surface, stress applied at the time of deforming the vibration plate can be reduced. Since a thickness t1 of the elastic body 17 in the area P3 is thinner than a thickness t2 of the elastic body 17 in the areas P1 and P2, a thickness of the vibration plate 21 in the area P3 is thinner than a thickness of the vibration plate 21 in the areas P1 and P2, and a thickness t5 is thinner than the thickness t1 of the elastic body 17 in the area P3 by providing the recess portion 30, the displacement characteristic of the vibration plate 21 in the outside of the piezoelectric element 19 can be improved.

Figure 7A:
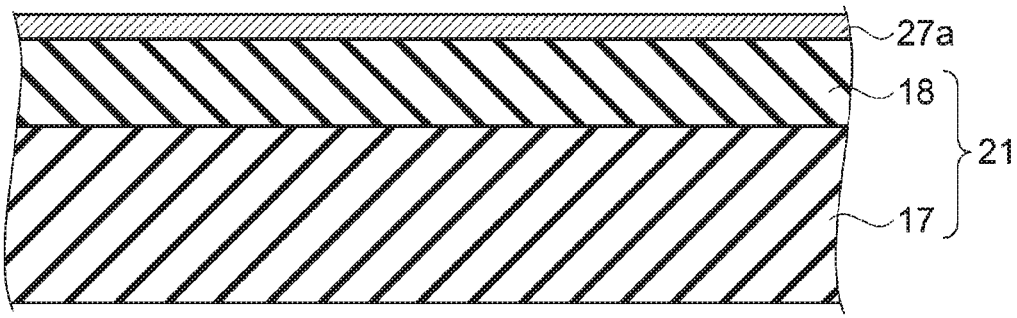
FIG. 7A is a schematic view illustrating a formation processing of the piezoelectric device in a first embodiment.
Figure 7B:
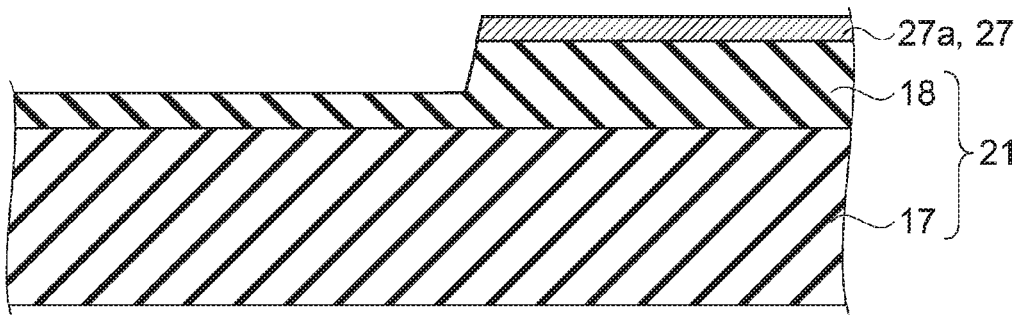
FIG. 7B is a schematic view illustrating the formation processing of the piezoelectric device in the first embodiment.

Next, a manufacturing method of the piezoelectric device 14 will be described. First, as illustrated in FIG. 7A, the insulation body 18 made of zirconium oxide (ZrOx) is formed on the elastic body 17 made of silicon oxide (SiOx) by a sputtering method, and the like. Next, a lower metal 27a, which is the lower electrode 27, is formed on the entire surface on the insulation body 18 by the sputtering method, and the like. After that, the lower metal 27a is patterned in a predetermined shape by etching. Specifically, by a photo lithography method, a resist pattern which is a mask with respect to the etching is provided on the lower metal 27a, and after the lower metal 27a is etched from the upper surface side by etching solution such as solution, the resist pattern is removed. At this time, the etching is carried out as the thickness of the lower metal 27a or more by controlling etching time, or the like, as illustrated in FIG. 7B, the insulation body 18 corresponding to the areas (areas P2 and P3) except the lower metal 27a which remains as the lower electrode 27, is etched. Accordingly, the insulation body 18 corresponding to the area P1 of the vibration plate 21 is not etched, and while the lower electrode 27 is formed on the insulation body 18, the insulation body 18 corresponding to the areas P2 and P3 of the vibration plate 21 is over-etched. As a result, a step is formed on a boundary between the area P1 and the area P2, and the insulation body 18 corresponding to the areas P2 and P3 is positioned one step lower than a part corresponding to the area P1.

Figure 7C:
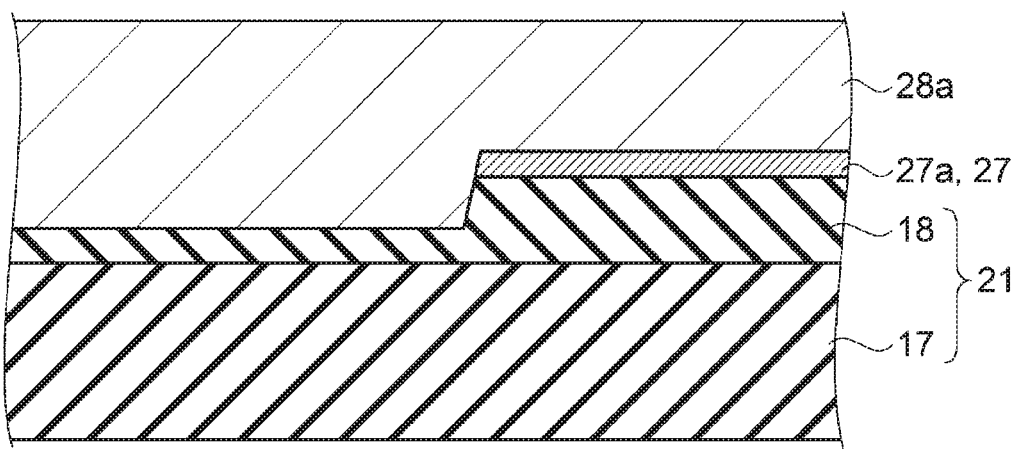
FIG. 7C is a schematic view illustrating the formation processing of the piezoelectric device in the first embodiment.

As illustrated in FIG. 7C, after the lower electrode 27 is formed on the insulation body 18, a PZT 28a which is the piezoelectric body 28 is formed on the entire surface on the insulation body 18 in which the lower electrode 27 is formed. The PZT 28a is an example of the piezoelectric body layer. A forming method for the PZT 28a is not particularly limited, and for example, a so called sol-gel method is used in which a so called sol, which is obtained by dissolving and dispersing metal organic material with catalyst, is coated and dried so as to be subjected to a gelation, and then the resultant thereof is further fired at a high temperature, such that the PZT 28a, which is metal oxide material is obtained.

At this time, when the piezoelectric body 28 is fired, lead included in the piezoelectric body material may be volatilized. When the volatilized lead is attached to silicon oxide of the elastic body 17 of a lower layer, lead glass having a low melting point is likely to be generated. In a case in which the lead glass is generated on the vibration plate 21 within a range of the pressure chamber 22, cracks may be generated on the vibration plate 21 based on a region which becomes the lead glass. The elastic body 17 can be prevented from being lead glass by sandwiching the insulation body 18 between the elastic body 17 and the piezoelectric body 28, and thus reliability of the vibration plate 21 can be improved.

Figure 7D:
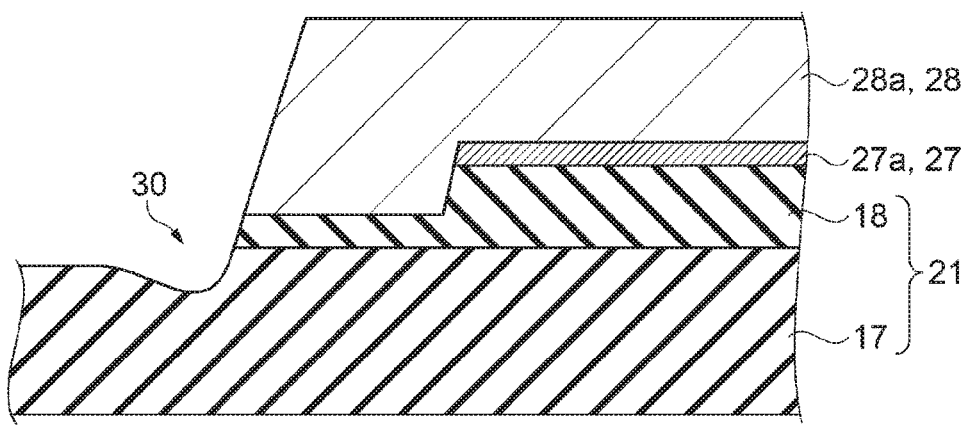
FIG. 7D is a schematic view illustrating the formation processing of the piezoelectric device in the first embodiment.

Moreover, as the forming method of the PZT 28a, other than the sol-gel method, the PZT 28a may be formed by various methods such as a sputtering or an IJ coating method. After that, by the photo lithography method, a resist pattern which is a mask with respect to the etching is formed on the PZT 28a, and after the PZT 28a is patterned in a predetermined shape by etching, the resist pattern is removed. At this time, the etching is performed as the thickness of the PZT 28a or more by controlling etching time, or the like, as illustrated in FIG. 7D, and while removing the insulation body 18 corresponding to an area (the area P3) except the PZT 28a which remains as the piezoelectric body 28, the elastic body 17 of the same area is etched. That is, by etching, the piezoelectric body 28 is patterned from the PZT 28a. At this time, when the anisotropic dry etching is used as the etching method of the piezoelectric body 28 and the elastic body 17, the recess portion 30 can be provided on a boundary between the elastic body 17 and the piezoelectric body 28. When the anisotropic dry etching is adopted as the etching method at this time, the recess portion 30 having a bottom surface of a curved surface shape is formed. In addition, accordingly, the elastic body 17 and the insulation body 18 corresponding to the areas P1 and P2 of the vibration plate 21 are not etched, and while the piezoelectric body 28 is formed on the upper surface thereof, the elastic body 17 corresponding to the area P3 (opening portion 28b) of the vibration plate 21 is over-etched. As a result, a step is formed on a boundary between the area P2 and the area P3 of the vibration plate 21, and the elastic body 17 corresponding to the area P3 is lower than the elastic body 17 corresponding to the area P2.

Figure 7E:
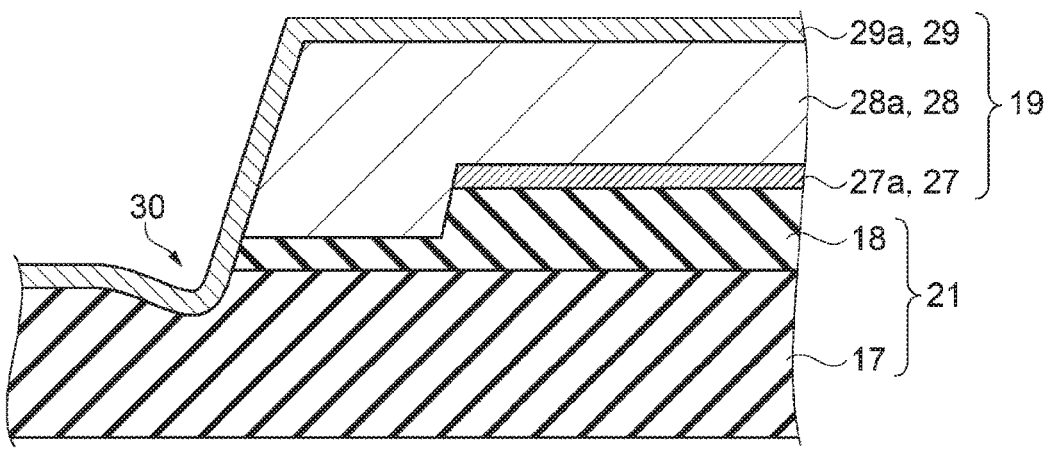
FIG. 7E is a schematic view illustrating the formation processing of the piezoelectric device in the first embodiment.

After that, as illustrated in FIG. 7E, an upper metal 29a, which is the upper electrode 29, is formed on the entire surface on the insulation body 18, in which the lower electrode 27 and the piezoelectric body 28 are formed, by the sputtering method, and the like. At this time, since the bottom surface of the recess portion 30 formed on the elastic body 17 is a curved surface shape, covering power or adhesion with respect to the recess portion 30 of the upper metal 29a formed by the sputtering method can be increased. Therefore, a function as the common electrode of the upper electrode 29 is sufficiently exerted. Also, a resist pattern which is a mask with respect to the etching is formed on the upper metal 29a by the photo lithography method, and after the upper metal 29a is patterned in a predetermined shape by etching, the resist pattern is removed. In this way, the piezoelectric device 14 of the embodiment can be formed. Since the upper electrode 29 formed as described above also functions as moisture resistance protection of the piezoelectric body, a process of forming a moisture resistance protective film is not required, and manufacturing costs can be reduced.

First Modification Example

Figure 8:
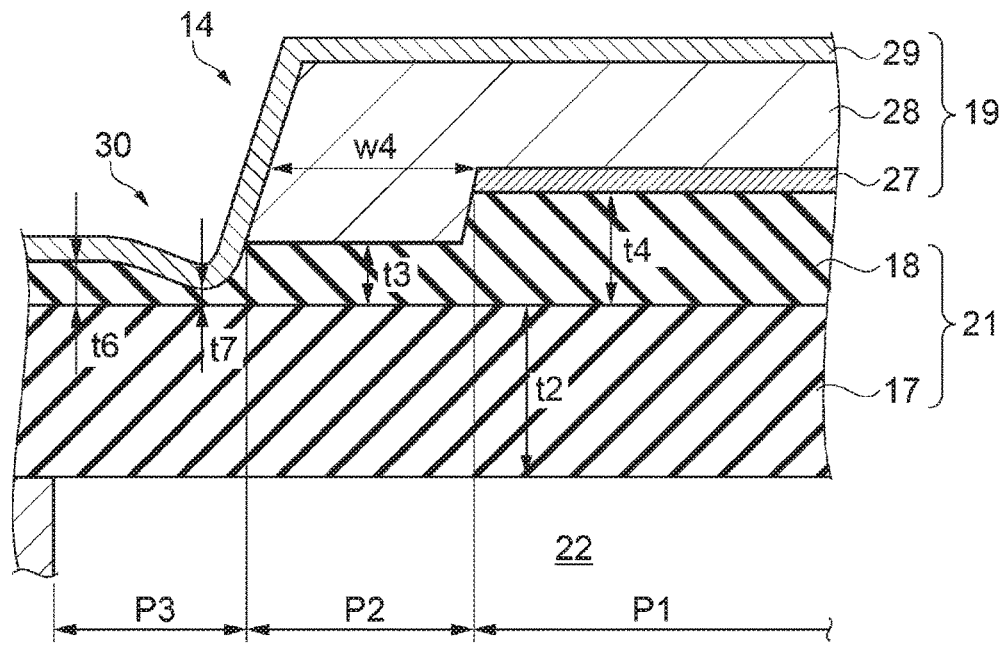
FIG. 8 is a sectional view illustrating a configuration of a piezoelectric device of a first modification example.
Figure 9:
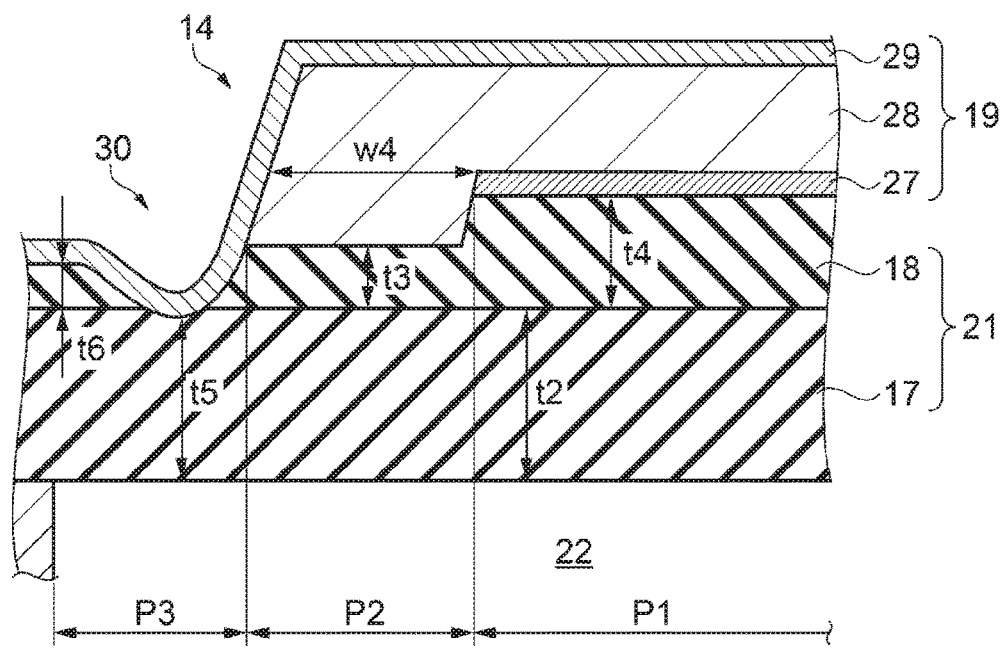
FIG. 9 is a sectional view illustrating the configuration of the piezoelectric device of the first modification example.

FIG. 8 is a sectional view illustrating a configuration of the piezoelectric device 14 of the first modification example. As illustrated in the drawing, in the modification example, the insulation body 18 is remained on the vibration plate 21 of the area P3, and the recess portion 30 having a curved bottom surface is formed on a boundary of the piezoelectric body 28 in the insulation body 18. With an exception of this point, the piezoelectric device 14 of the first modification example has the same configuration as the piezoelectric device 14 of the first embodiment. Therefore, configurations in the first modification example same as those of the first embodiment are given the same numbers as those of the first embodiment, and detailed description thereof will be omitted. In the first modification example, as illustrated in FIG. 9, the recess portion 30 may reach the elastic body 17 in the vibration plate 21. According to the configuration of the first modification example illustrated in FIG. 8 or FIG. 9, since rigidity of the vibration plate 21 of the area P3 can be increased when compared with the first embodiment, reliability with respect to mechanical damage can be improved. Further, in an example illustrated in FIG. 9, when compared with an example illustrated in FIG. 8, since the recess portion 30 is formed to be deeper than the vibration plate 21, rigidity of the vibration plate 21 is deteriorated, and thus the displacement characteristic is improved.

A manufacturing method of the modification example is the same as that of the first embodiment. However, since the insulation body 18 is remained in the area P3 as described above, etching is performed at a degree of which the insulation body 18 is remained at the time of patterning the piezoelectric body 28 from the piezoelectric body layer 28a. Even in the etching method at this time, the recess portion 30 can be formed on a boundary with the piezoelectric body 28 in the insulation body 18 by adopting the anisotropic dry etching.

However, in the modification example, a case in which the vibration plate 31 has a structure of two layers of the elastic body 17 and the insulation body 18 is exemplified, but the number of layers of the vibration plate 21 may be three or more, or may be one layer.

Second Modification Example

Figure 10:
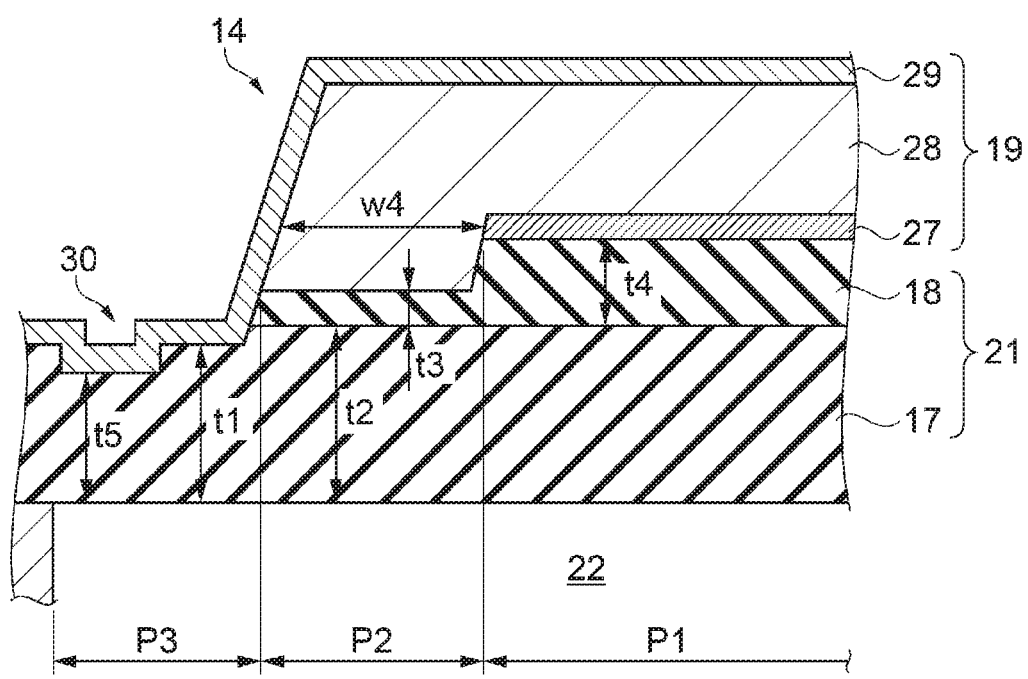
FIG. 10 is a sectional view illustrating a configuration of a piezoelectric device of a second modification example.

FIG. 10 is a sectional view illustrating a configuration of the piezoelectric device 14 of the second modification example. In the modification example, a position of the recess portion 30 is different from that of the first embodiment. In the second modification example, the recess portion 30 is positioned on a side opposite to the area P2 side of the area P3 further than the first embodiment. In the first embodiment, the recess portion 30 is formed on a boundary areas overlapping with the piezoelectric body 28 in the elastic body 17. With respect to that, in the second modification example, the recess portion 30 is formed on a side opposite to the piezoelectric body 28 further than the boundary areas overlapping with the piezoelectric body 28 in the elastic body 17. Except that, the piezoelectric device 14 of the second modification example has the same configuration as that of the piezoelectric device 14 of the first embodiment. Therefore, regarding the configurations of the first embodiment same as those of in the second modification example, the same numerals are given to those of the first embodiment, and detailed description thereof will be omitted. According to this configuration, when compared with the first embodiment, regarding a part interfered with deformation of the vibration plate 21, rigidity thereof is deteriorated, and the displacement characteristic can be improved.

Figure 11A:
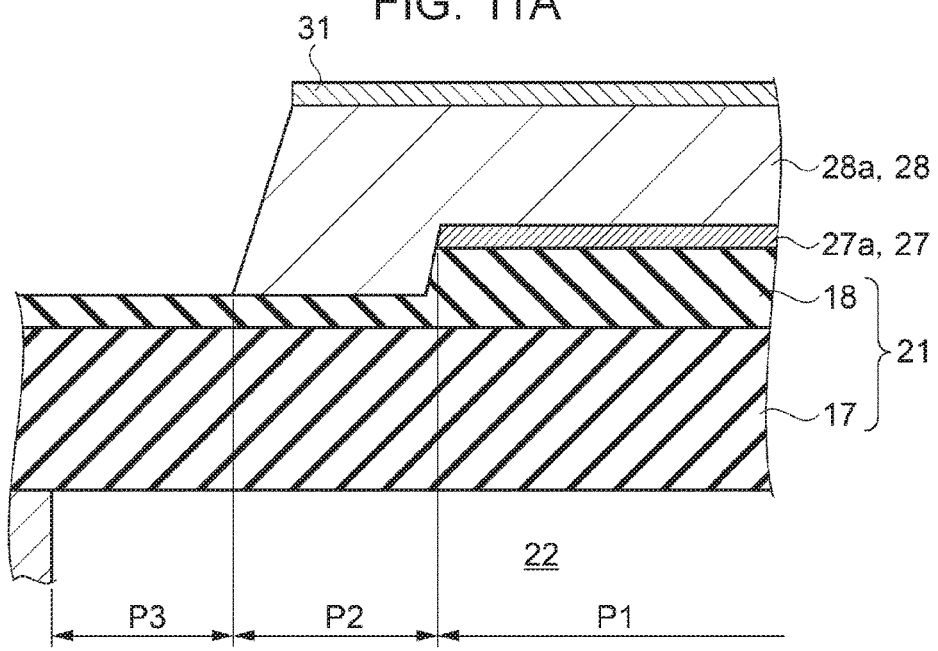
FIG. 11A is a schematic view illustrating a formation processing of the piezoelectric device of the second modification example.
Figure 11B:
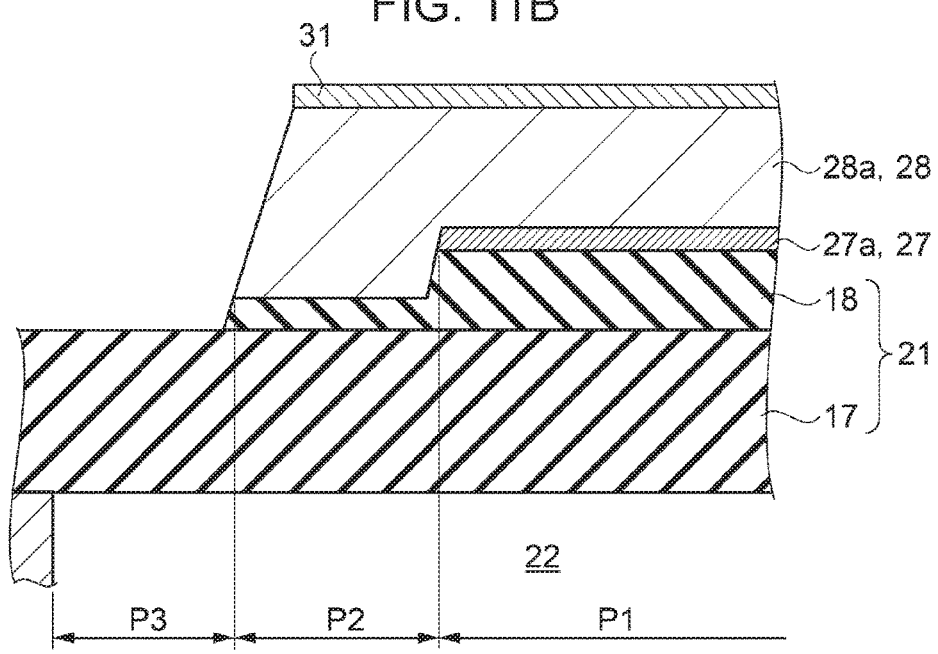
FIG. 11B is a schematic view illustrating a formation processing of the piezoelectric device of the second modification example.

The manufacturing method of the modification example, description up to film forming of the piezoelectric body layer 28a (FIG. 7C) is the same as that of the first embodiment. As illustrated in FIG. 11A, as a method of forming the piezoelectric body 28 from the PZT 28a, a resist pattern 31 which is a mask with respect to the etching is formed on the PZT 28a by a photo lithography method, and the PZT 28a is patterned in a predetermined shape by etching. However, as an etching method of the piezoelectric body 28, an isotropic wet etching is adopted. In a case in which the piezoelectric body 28 is formed by the isotropic wet etching, when compared a case in which the piezoelectric body 28 is formed by the anisotropic dry etching (FIG. 7D), a recess portion is not formed on a boundary between the PZT 28a and the vibration plate 21. In addition, a mixture solution of hydrochloric acid and hydrofluoric acid is used as an etching solution in many cases, and in a case in which the etching solution is used, as illustrated in FIG. 11A, the insulation body 18 in the area P3 is not etched, and thus a process of removing the insulation body 18 in the area P3 not overlapping with the PZT 28a is added. At this time, as illustrated in FIG. 11B, the piezoelectric body 28 is used as a mask, and the isotropic wet etching or the anisotropic dry etching are performed using another etching solution. Accordingly, the insulation body 18 can be removed from the area P3. After that, the resist pattern 31 is removed.

Figure 12A:
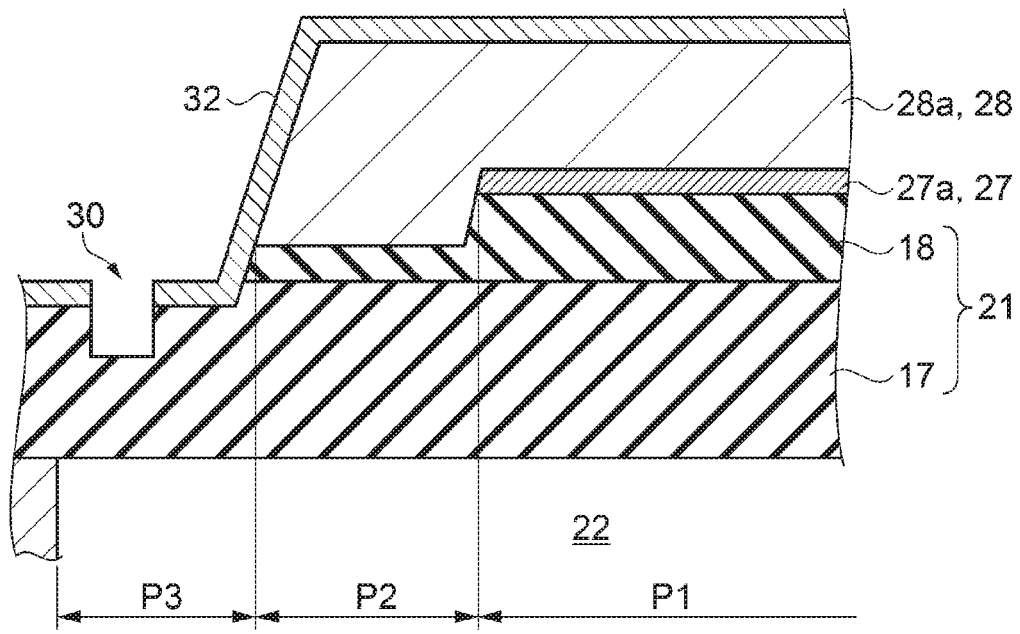
FIG. 12A is a schematic view illustrating a formation processing of the piezoelectric device of the second modification example.
Figure 12B:
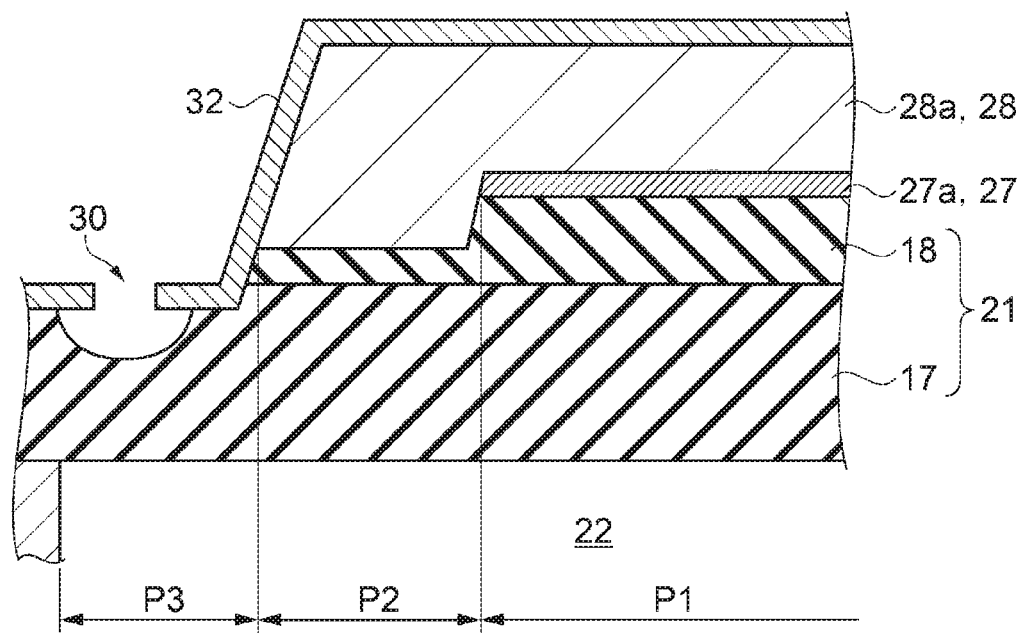
FIG. 12B is a schematic view illustrating a formation processing of the piezoelectric device of the second modification example.

Next, as illustrated in FIG. 12A, in the process of forming the recess portion 30, a resist pattern 32 which is a mask with respect to the etching is formed on the vibration plate 21 (elastic body 17) of the area P3, and the elastic body 17 of the vibration plate 21 is patterned in a predetermined shape by etching, and after that, the resist pattern 32 is removed. At this time, as illustrated in FIG. 12A, the recess portion 30 in which a bottom surface and walls have an angle portion is formed by adopting the anisotropic dry etching. In addition, as illustrated in FIG. 12B, the recess portion 30 having the bottom surface of a curved surface shape can also be formed by adopting the isotropic wet etching. When the recess portion 30 having the bottom surface of a curved surface shape is used, in addition to that covering power or adhesion of the upper electrode 29 becomes good, as described above, stress applied at the time of deforming the vibration plate 21 can be reduced, and thus reliability of the piezoelectric device can be increased. Another formation of the upper electrode 29 is the same as that of the first embodiment.

However, in the modification example, a case in which the vibration plate 31 has a structure of two layers of the elastic body 17 and the insulation body 18 is exemplified, but the number of layers of the vibration plate 21 may be three layers or more or may be one layer.

Third Modification Example

Figure 13:
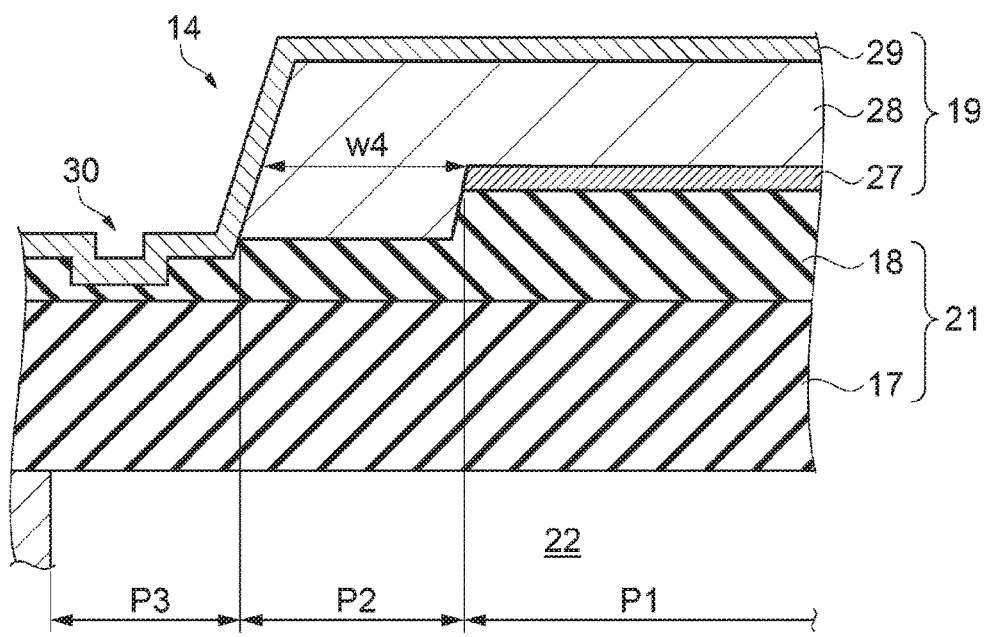
FIG. 13 is a sectional view illustrating a configuration of a piezoelectric device of a third modification example.
Figure 14:
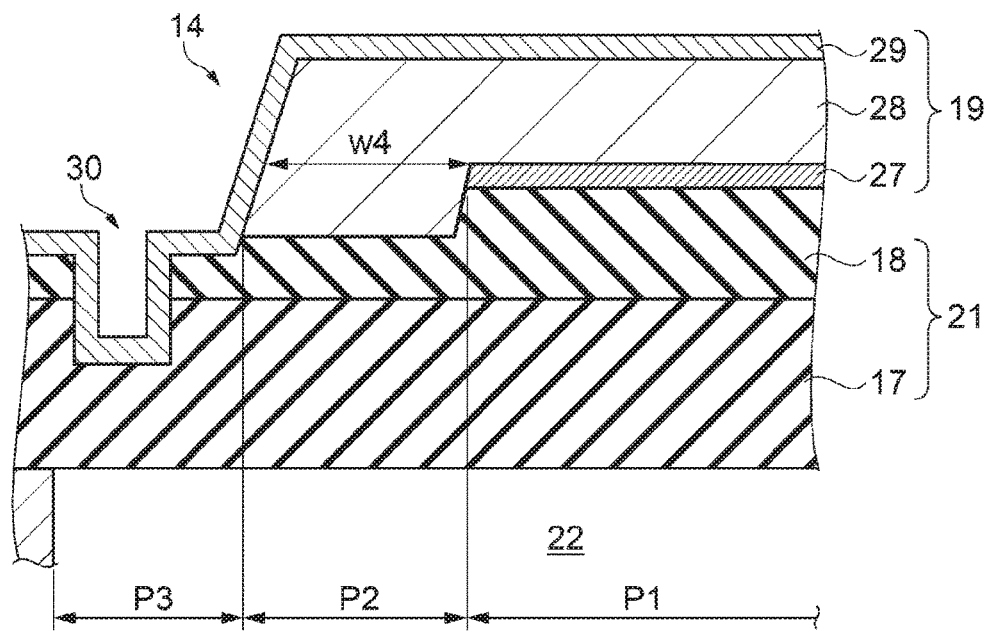
FIG. 14 is a sectional view illustrating the configuration of the piezoelectric device of the third modification example.

In the third modification example, as illustrated in FIG. 13, the insulation body 18 is remained on the vibration plate 21 in the area P3, and the recess portion 30 is formed on the insulation body 18 in the area P3. With an exception of this point, the piezoelectric device 14 of the third modification example has the same configuration as the piezoelectric device 14 in the second modification example. Therefore, regarding the same configuration of the second modification example or the first embodiment in the third modification example, the same numerals as those of the second modification example or the first embodiment are given thereto, and detailed description thereof will be omitted. In addition, in the third modification example, as illustrated in FIG. 14, the recess portion 30 may reach the elastic body 17 in the vibration plate 21. According to the third modification example illustrated in FIG. 13 or FIG. 14, since stiffness of the vibration plate 21 in the area P3 can be increased when compared with the second modification example, reliability with respect to mechanical damage can be improved. Further, in this configuration, when the recess portion 30 having the bottom surface of a curved surface shape is formed by the isotropic wet etching, stress applied at the time of deforming the vibration plate 21 can be reduced, and reliability of the piezoelectric device 14 can be further increased. In addition, in an example in FIG. 14, when compared with the example illustrated in FIG. 13, since the recess portion 30 is formed to be deeper to reach the elastic body 17 of the vibration plate 21, the stiffness of the vibration plate 21 is deteriorated, and the displacement characteristic is improved.

The manufacturing method of the modification example is the same as that of the second modification example. However, since the insulation body 18 is remained in the area P3 as described above, after the piezoelectric body 28 is patterned from the piezoelectric body layer 28a, a process of removing the insulation body 18 is not performed. Otherwise, the isotropic wet etching may be performed at a degree of which the insulation body 18 is remained in the area P3. Even in subsequent processes, it is the same as that of the second modification example.

However, in the modification example, a case in which the vibration plate 31 has two layers of the elastic body 17 and the insulation body 18 is exemplified, but the number of layers of the vibration plate 21 may be three layers or more or may be one layer.

Fourth Modification Example

Figure 15:
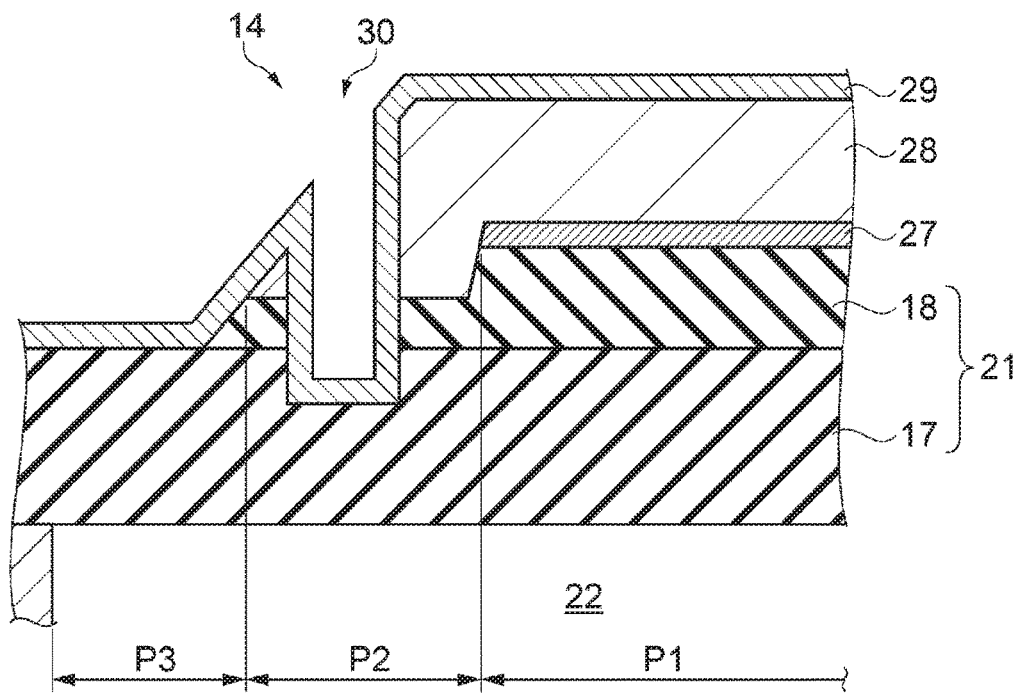
FIG. 15 is a sectional view illustrating a configuration of the piezoelectric device of a fourth modification example.

In a fourth modification example, as illustrated in FIG. 15, the insulation body 18 on the vibration plate 21 of the area P3 is removed, and the recess portion 30 on the elastic body 17 of the area P2 is formed. With an exception of this point, the fourth modification example has the same configuration as that of the second modification example or the third modification example. Therefore, the configuration of the second modification example or the third modification example in the fourth modification example is given the same numerals as those of the second modification example or the third modification example, and detailed description thereof will be omitted. In the fourth modification example, the recess portion 30 is formed on a range where the lower electrode 27 in the piezoelectric body 28 does not overlap, in other words, on a part outside an area where the lower electrode 27 in the piezoelectric body 28 overlaps. That is, since the recess portion 30 is formed on a part which does not contribute to displacement of the piezoelectric body 28, it does not interfere driving of the piezoelectric element 19. In an example of FIG. 15, the recess portion 30 penetrates the insulation body 18 from the piezoelectric body 28 and reaches the elastic body 17. According to the fourth modification example, since stiffness of a part which does not contribute to the displacement in the piezoelectric body 28 can be reduced, the displacement characteristic of the vibration plate 21 is improved. Moreover, in the fourth modification example, a configuration in which the recess portion 30 is formed on only the piezoelectric body 28, a configuration in which the recess portion 30 reaches the insulation body 18 by penetrating the piezoelectric body 28 and stops on the insulation body 18, or the like can be adopted. In such a configuration, reliability with respect to mechanical damage of the vibration plate 21 is improved.

Figure 16:
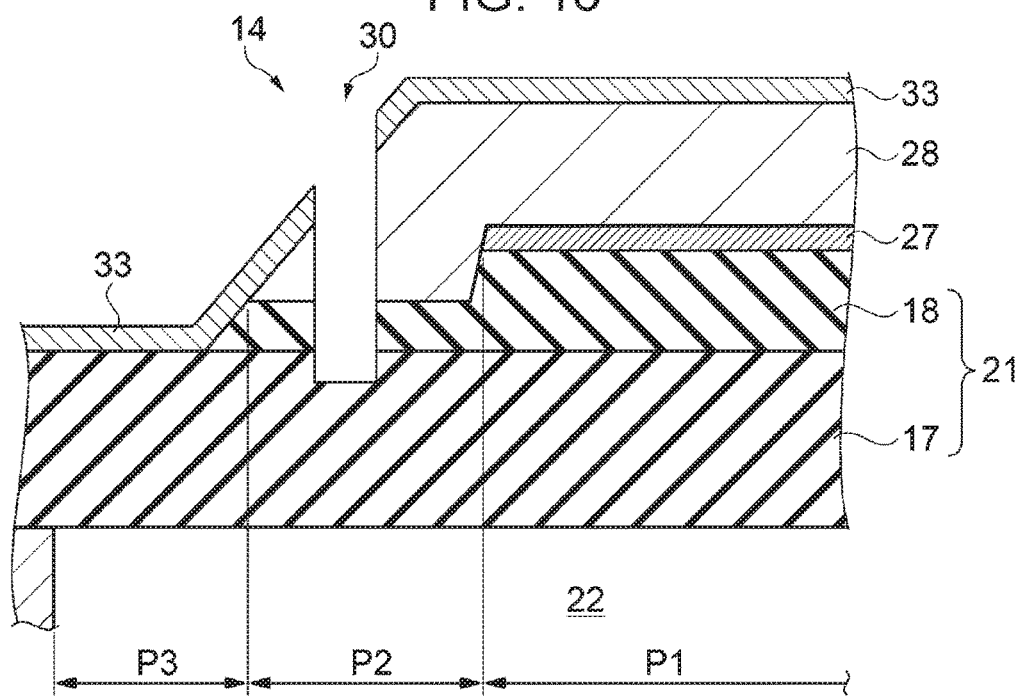
FIG. 16 is a schematic view illustrating a formation processing of the piezoelectric device of the fourth modification example.

The manufacturing method of the modification example is the same as that of the second modification example. However, as illustrated in FIG. 16, as the forming method of the recess portion 30, a resist pattern 33 which is a mask with respect to the etching is formed on the piezoelectric body 28 of area P2, and the elastic body 17 of the vibration plate 21 is patterned in a predetermined shape by etching, after that, the resist pattern 33 is removed. At this time, as illustrated in FIG. 16, the recess portion 30 in which a bottom surface and walls have an angle portion is formed by adopting the anisotropic dry etching. In addition, in a case in which the recess portion 30 stops on the insulation body 18 in the vibration plate 21 or, a case in which a depth of the recess portion 30 reaches the inside of the piezoelectric body 28, etching time or outputting of a device may be adjusted.

However, in the modification example, an example of which the vibration plate 31 has a structure of two layers of the elastic body 17 and the insulation body 18 is exemplified, but the number of layers of the vibration plate 21 may be three or more, or may be one layer.

Fifth Modification Example

Figure 17:
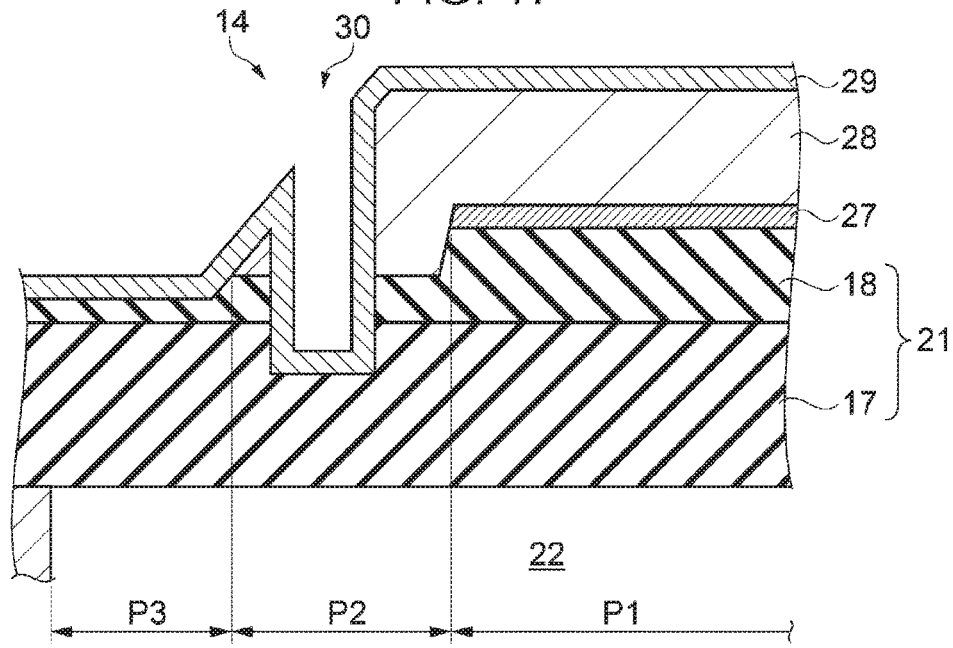
FIG. 17 is a sectional view illustrating a configuration of a piezoelectric device of a fifth modification example.

In a fifth modification example, as illustrated in FIG. 17, the insulation body 18 is remained on the vibration plate 21 of the area P3, and the recess portion 30 is formed on the elastic body 17 of the area P2. With an exception of this point, the fifth modification example has the same configuration as the fourth modification example. Therefore, configurations in the fifth modification example is same as those of the fourth modification example from the second modification example are given the same numbers as those of the fourth modification example from the second modification example, and detailed description thereof will be omitted. In the fifth modification example, the recess portion 30 is formed on a range where the lower electrode 27 in the piezoelectric body 28 does not overlap, in other words, on a part outside an area where the lower electrode 27 in the piezoelectric body 28 overlaps. That is, since the recess portion 30 is formed on a part which does not contribute to displacement of the piezoelectric body 28, it does not interfere driving of the piezoelectric element 19. In an example of FIG. 17, the recess portion 30 penetrates the insulation body 18 from the piezoelectric body 28 and reaches the elastic body 17. Even in the fifth modification example, the same effect as the fourth modification example can be obtained. Further, According to the fifth modification example, when compared with the fourth modification example, since stiffness of the vibration plate 21 can be improved, reliability with respect to mechanical damage of the vibration plate 21 is improved. Moreover, in the fifth modification example, a configuration in which the recess portion 30 is formed on only the piezoelectric body 28, a configuration in which the recess portion 30 reaches the insulation body 18 by penetrating the piezoelectric body 28 and stops on the insulation body 18, or the like can be adopted. In such a configuration, reliability with respect to mechanical damage of the vibration plate 21 is improved.

Regarding the manufacturing method of the modification example, a process until the recess portion 30 is formed is the same as that of the third modification example, and a process of forming the recess portion 30 and a subsequent process thereof forming the recess portion 30 are the same as those of the fourth modification example.

However, in the modification example, a case in which the vibration plate 31 has a structure of two layers of the elastic body 17 and the insulation body 18 is exemplified, but the number of layers of the vibration plate 21 may be three layers or more or may be one layer.

The invention is not limited to the embodiments or the modification examples described above. For example, in the embodiments or the modification examples described above, the thickness t4 of the insulation body 18 in the area P1 is thicker than the thickness t3 of the insulation body 18 in the area P2; however, it is not limited thereto, and the thickness t4 of the insulation body 18 in the area P1 and the thickness t3 of the insulation body 18 in the area P2 can be formed to be the same as each other. In addition, the thickness t1 of the elastic body 17 in the area P3 is thinner than the thickness t2 of the elastic body 17 in the areas P1 and P2; however, it is not limited thereto, and the thickness t1 of the elastic body 17 in the area P3 and the thickness t2 of the elastic body 17 in the areas P1 and P2 can be formed to be the same as each other.

In addition, in the above described embodiment, in the area of the vibration plate 21 in the area corresponding to the pressure chamber 22, the entirety of the area in which the lower electrode 27, the piezoelectric body 28, and the upper electrode 29 are stacked is the area P1, the entirety of the area in which the piezoelectric body 28 and the upper electrode 29 deviated from the lower electrode 27 are stacked is the area P2, the entirety of the area in which only the upper electrode 29 deviated from the lower electrode 27 and the piezoelectric body 28 is stacked is the area P3; however, it is not limited thereto. In each area, there may be an area having a difference thickness of the vibration plate. For example, the area in which the piezoelectric body 28 and the upper electrode 29 deviated from the lower electrode 27 are stacked may include the area P2 configured to have the elastic body 17 and the insulation body 18 and an area P2' having the thickness of the vibration plate 21 thicker or thinner than that of the area P2. In addition, the area in which only the upper electrode 29 deviated from the lower electrode 27 and the piezoelectric body 28 is stacked may include the area P3 formed of the elastic body 17 and an area P3' having the thickness of the elastic body 17 thicker or thinner than that of the area P3. Further, the area P1 also has the same configuration. Here, particularly, in a case in which the area P2' is thicker than the area P2, the area P2 which is greater (wider) than the area P2' has a great effect of a hindrance of the deformation of the vibration plate. In addition, the configuration is also the same as in a case in which the area P3' is thicker than the area P3. A difference in the thickness of the vibration plate in such an area may be made by manufacturing tolerance, or the like.

Further, the shape of the pressure chamber 22 (pressure chamber space) is not limited to the above embodiment. For example, an inner wall surface which divides the pressure chamber space may be respectively inclined with respect to upper and lower surfaces of the pressure chamber forming substrate 15. In this case, the width of the above described pressure chamber 22 corresponds to an opening width of the upper opening of the pressure chamber space.

Figure 18:
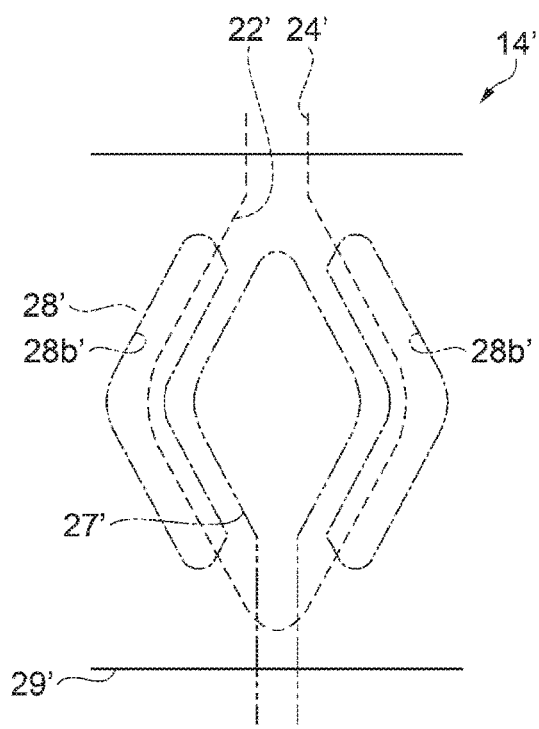
FIG. 18 is a plan view of the piezoelectric device in a second embodiment.

In the embodiment, the upper opening of the pressure chamber space (pressure chamber 22) is a trapezoid shape, and the opening portion 28b formed on the piezoelectric body 28 is a hexagon shape; however, it is not limited thereto. The shape of the pressure chamber space (pressure chamber), the shape of the piezoelectric body (opening portion), the shape of each of electrode layer, and the like can be various shapes. For example, as illustrated in FIG. 18, in a piezoelectric device 14' of a second embodiment, in a plan view, the upper opening of the pressure chamber space (pressure chamber 22') is an elliptical shape. In addition, a lower electrode 27' is substantially an elliptical shape by matching with a shape of the pressure chamber 22'. Further, opening portions 28b' in the piezoelectric body 28 are formed on both sides in the nozzle row direction of the pressure chamber 22' along an edge of the upper opening of the pressure chamber 22'. Moreover, in the same manner as the above described embodiment, the upper electrode 29' is formed so as to extend to the outside of a plurality of the pressure chambers 22' in a pressure chamber row direction (nozzle row direction). In addition, the upper electrode 29' in a longitudinal direction of the pressure chamber 22' extends to a position where an end portion of one side (upper side in FIG. 18) overlaps the ink supply passage 24', and an end portion of the other side (lower side in FIG. 18) extends to the outside of the pressure chamber 22'.

Here, even in the embodiment, a size of each layer in the nozzle row direction is small in the order of a width of the upper electrode 29', a width of the pressure chamber 22', a width of the piezoelectric body 28', and a width of the lower electrode 27'. For this reason, there are the area P1 in which the lower electrode 27', the piezoelectric body 28', and the upper electrode 29' are stacked, the area P2 in which the piezoelectric body 28' and the upper electrode 29' deviated from the lower electrode 27' are stacked, and the area P3 in which only the upper electrode 29' deviated from the lower electrode 27' and the piezoelectric body 28' is stacked. In addition, while removing the insulation body of the area P3, the relationship of the thickness of the vibration plate in each of the areas P1, P2, and P3 of the vibration plate is satisfied by the expression of P1>P2>P3. Accordingly, while the piezoelectric body 28' in the initial state can be prevented from excessively bending, and the hindrance of the movement of the vibration plate in the outside of the piezoelectric body 28' can be suppressed. Moreover, since other configuration thereof is the same as that of the embodiment, descriptions of other configurations are omitted.

In addition, in the above described embodiment, the ink jet recording head mounted on the ink jet printer is exemplified; however, a configuration can also be applied to an apparatus which ejects liquid other than the ink as long as the piezoelectric device of the above described configuration is included. For example, the invention can be applied to a color material ejecting head which is used for manufacturing a color filter of a liquid crystal display, or the like, an organic electro luminescence (EL) display, an electrode material ejecting head used for forming an electrode of field emission display (FED), or the like, and a biochemical organic substance ejecting head used for manufacturing a biochip (biochemical substance element), or the like.

In addition, the invention is not limited to a use to the liquid ejecting head or the liquid ejecting apparatus as an actuator, and for example, can also be applied to the piezoelectric device, or the like which is used to various sensors, or the like.

What is claimed is:

1. A piezoelectric device comprising:
a supporting body;
a supporting layer that is formed on the supporting body;
a first electrode that is formed on the supporting layer;
a piezoelectric body that is formed on the first electrode;
a second electrode that is formed on the piezoelectric body; and
a first recess that is formed in the supporting layer,
wherein the supporting layer and the piezoelectric body overlap each other in an overlapped area in a plan view, and
the first recess is laterally shifted from the overlapped area in the plan view.

2. The piezoelectric device according to claim 1,
wherein a bottom surface of the first recess is a curved surface.

3. A liquid ejecting head comprising:
the piezoelectric device according to claim 2; and
a plurality of nozzles that eject liquid.

4. A liquid ejecting apparatus comprising:
the liquid ejecting head according to claim 3; and
a container that stores the liquid.

5. The piezoelectric device according to claim 1,
wherein the supporting layer is a stacked layer of a first supporting layer and a second supporting layer, the first supporting layer is formed on the supporting body, and the second supporting layer is formed on the first supporting layer, and
wherein a bottom surface of the first recess is formed in the first supporting layer.

6. The piezoelectric device according to claim 5,
wherein the piezoelectric body is made of a material including lead, and
wherein the second supporting layer is made of zirconia.

7. The piezoelectric device according to claim 6,
wherein the first supporting layer is made of silicon oxide.

8. A liquid ejecting head comprising:
the piezoelectric device according to claim 7; and
a plurality of nozzles that eject liquid.

9. A liquid ejecting apparatus comprising:
the liquid ejecting head according to claim 8; and
a container that stores the liquid.

10. A liquid ejecting head comprising:
the piezoelectric device according to claim 6; and
a plurality of nozzles that eject liquid.

11. A liquid ejecting apparatus comprising:
the liquid ejecting head according to claim 10; and
a container that stores the liquid.

12. A liquid ejecting head comprising:
the piezoelectric device according to claim 5; and
a plurality of nozzles that eject liquid.

13. A liquid ejecting apparatus comprising:
the liquid ejecting head according to claim 12; and
a container that stores the liquid.

14. A liquid ejecting head comprising:
the piezoelectric device according to claim 1; and
a plurality of nozzles that eject liquid.

15. A liquid ejecting apparatus comprising:
the liquid ejecting head according to claim 14; and
a container that stores the liquid.

16. The piezoelectric device according to claim 1, further comprising:
pressure chambers that are formed in the supporting body, the pressure chambers being formed in parallel in a first direction via a partition wall, the supporting layer being formed on the supporting body and the pressure chambers, the pressure chambers communicating with each of nozzles through which liquid is ejected; and
a second recess that is formed in the supporting layer, the second recess being laterally shifted from the overlapped area in the plan view;
wherein the second recess is formed at an opposite side to the first recess with respect to the overlapped area in the first direction, and
the first recess and the second recess are formed directly above one of the pressure chambers in the plan view.

17. A manufacturing method of a piezoelectric device comprising:
forming a supporting layer on a supporting body;
forming a first electrode on the supporting layer;
forming a piezoelectric layer on the first electrode;
patterning the piezoelectric layer so as to form a piezoelectric body, the piezoelectric body completely overlapping the first electrode in a plan view;
forming a recess in the supporting layer; and
forming a second electrode on the piezoelectric body, wherein
when the piezoelectric body is patterned from the piezoelectric layer, the recess is also formed in the supporting body,
the supporting layer and the piezoelectric body overlap each other in an overlapped area in the plan view, and
the recess is laterally shifted from the overlapped area in the plan view.

18. A piezoelectric device comprising:
a supporting body;
a supporting layer that is formed on the supporting body;
a first electrode that is formed on the supporting layer;
a piezoelectric body that is formed on the first electrode;
a second electrode that is formed on the piezoelectric body; and
a recess that is formed in the supporting layer,
wherein the second electrode is formed on a bottom surface of the recess.

19. The piezoelectric device according to claim 18,
wherein the supporting layer and the piezoelectric body are overlapped with each other in an overlapped area in a plan view, and
the recess is laterally shifted from the overlapped area in the plan view.

20. The piezoelectric device according to claim 18,
wherein the bottom surface of the recess is a curved surface.

21. The piezoelectric device according to claim 18,
wherein the supporting layer is a stacked layer of a first supporting layer and a second supporting layer, the first supporting layer is formed on the supporting body, and the second supporting layer is formed on the first supporting layer, and
wherein the bottom surface of the recess is formed in the first supporting layer.

* * * * *